United States Patent
Ong

(10) Patent No.: US 7,309,999 B2
(45) Date of Patent: Dec. 18, 2007

(54) ELECTRONIC DEVICE HAVING AN INTERFACE SUPPORTED TESTING MODE

(75) Inventor: Adrian E. Ong, San Jose, CA (US)

(73) Assignee: Inapac Technology, Inc., San Jose, CA (US)

(*) Notice: Subject to any disclaimer, the term of this patent is extended or adjusted under 35 U.S.C. 154(b) by 143 days.

(21) Appl. No.: 11/207,665

(22) Filed: Aug. 18, 2005

(65) Prior Publication Data

US 2006/0279308 A1   Dec. 14, 2006

Related U.S. Application Data

(60) Continuation-in-part of application No. 11/108,385, filed on Apr. 18, 2005, now Pat. No. 7,259,582, which is a division of application No. 10/608,613, filed on Jun. 27, 2003, now Pat. No. 6,882,171, which is a continuation-in-part of application No. 10/305,635, filed on Nov. 27, 2002, now Pat. No. 6,812,726, application No. 11/207,665, which is a continuation-in-part of application No. 10/679,673, filed on Oct. 3, 2003, now Pat. No. 7,006,940.

(51) Int. Cl.
*G01R 31/26* (2006.01)

(52) U.S. Cl. .................... 324/765; 324/763

(58) Field of Classification Search ............... None
See application file for complete search history.

(56) References Cited

U.S. PATENT DOCUMENTS

| | | | |
|---|---|---|---|
| 5,594,694 A | 1/1997 | Roohparvar et al. | |
| 6,191,603 B1 | 2/2001 | Muradali et al. | |
| 6,205,082 B1 | 3/2001 | Tomita et al. | |
| 6,216,240 B1 * | 4/2001 | Won et al. | 714/718 |
| 6,366,487 B1 | 4/2002 | Yeom | |
| 6,457,141 B1 * | 9/2002 | Kim et al. | 714/30 |
| 6,492,727 B2 * | 12/2002 | Nishizawa et al. | 257/723 |
| 6,519,171 B2 | 2/2003 | Matsuzaki et al. | |
| 6,711,042 B2 * | 3/2004 | Ishikawa | 365/51 |

(Continued)

OTHER PUBLICATIONS

U.S. Appl. No. 11/552,944, filed Oct. 25, 2006, Adrian Ong, Integrated Circuit Testing Module Configured for Set-up and Hold-Time Testing.

(Continued)

*Primary Examiner*—Minh N. Tang
(74) *Attorney, Agent, or Firm*—Carr & Ferrell LLP

(57) ABSTRACT

A system is provided for testing a first integrated circuit chip associated with at least a second integrated circuit chip in a semiconductor device, wherein at least some external terminals for the semiconductor device are to be shared by the first and second integrated circuit chips, and wherein the first integrated circuit chip is designed for normal operation and a test mode. The system includes a plurality of multiplexer circuits. Each multiplexer circuit is operable to receive a respective signal from the second integrated circuit chip when the first integrated circuit chip is in normal operation. Each multiplexer circuit is further operable to receive a respective signal from either the second integrated circuit chip or an associated external terminal when the first integrated circuit chip is in test mode. An external terminal of the semiconductor device operable to receive a signal for causing the first integrated circuit chip to transition between normal operation and the test mode.

38 Claims, 20 Drawing Sheets

U.S. PATENT DOCUMENTS

| | | |
|---|---|---|
| 6,732,304 B1 | 5/2004 | Ong |
| 6,812,726 B1 | 11/2004 | Ong |
| 6,825,683 B1 | 11/2004 | Berndt et al. |
| 6,882,171 B2 | 4/2005 | Ong |
| 6,967,397 B2 * | 11/2005 | Inoue et al. ............... 257/686 |
| 6,996,745 B1 | 2/2006 | Shaylor |
| 7,006,940 B1 | 2/2006 | Ong |
| 7,061,263 B1 | 6/2006 | Ong |
| 7,075,175 B2 | 7/2006 | Kazi et al. |
| 7,133,798 B1 | 11/2006 | Ong |
| 7,139,945 B2 | 11/2006 | Ong |
| 7,149,135 B2 | 12/2006 | Okuno |
| 2004/0100296 A1 | 5/2004 | Ong |
| 2004/0150089 A1 | 8/2004 | Inoue et al. |
| 2004/0196709 A1 | 10/2004 | Ong |
| 2005/0024977 A1 | 2/2005 | Ong |
| 2005/0204223 A1 | 9/2005 | Ong |
| 2005/0289428 A1 | 12/2005 | Ong |
| 2006/0152241 A1 | 7/2006 | Ong |

OTHER PUBLICATIONS

U.S. Appl. No. 11/552,938, filed Oct. 25, 2006, Adrian Ong, Integrated Circuit Testing Module Including Signal Shaping Interface.

U.S. Appl. No. 11/538,799, filed Oct. 4, 2006, Adrian Ong, Testing and Recovery in a Multilayer Device.

U.S. Appl. No. 11/480,234, filed Jun. 30, 2006, Adrian Ong, Delay Lock Loop Delay Adjusting Method and Apparatus.

U.S. Appl. No. 11/479,061, filed Jun. 30, 2006, Adrian Ong, Integrated Circuit Test Array Including Test Module.

U.S. Appl. No. 11/472,016, filed Jun. 20, 2006, Adrian Ong, Shared memory bus architecture for system with processor and memory units.

U.S. Appl. No. 11/443,872, filed May 30, 2006, Adrian Ong, Integrated Circuit Testing Module Including Command Driver.

U.S. Appl. No. 11/370,795, filed Mar. 7, 2006, Adrian Ong, Integrated Circuit Testing Module Including Address Generator.

U.S. Appl. No. 11/370,769, filed Mar. 7, 2006, Adrian Ong, Integrated Circuit Testing Module Including Data Generator.

U.S. Appl. No. 11/369,878, filed Mar. 6, 2006, Adrian Ong, Integrated Circuit Testing Module Including Data Compression.

U.S. Appl. No. 11/304,445, filed Dec. 14, 2005, Adrian Ong, Integrated circuit testing module.

U.S. Appl. No. 11/258,484, filed Oct. 24, 2005, Adrian Ong, Component testing and recovery.

U.S. Appl. No. 11/223,286, filed Sep. 9, 2005, Adrian Ong, Shared bond pad for testing a memory within a packaged semiconductor device.

U.S. Appl. No. 11/208,099, filed Aug. 18, 2005, Adrian Ong, A Processor Memory Unit for Use in System-in-Package and System-in-Module Devices.

U.S. Appl. No. 11/207,518, filed Aug. 19, 2005, Adrian Ong, Architecture and method for testing of an integrated circuit device.

U.S. Appl. No. 11/108,385, filed Apr. 18, 2005, Adrian Ong, Bonding Pads for Testing of a Semiconductor Device.

U.S. Appl. No. 11/083,473, filed Mar. 18, 2005, Adrian Ong, Internally Generating Patterns for Testing in an Integrated Circuit Device.

U.S. Appl. No. 10/877,687, filed Jun. 25, 2004, Adrian Ong, Multiple Power Levels for a Chip Within a Multi-Chip Semiconductor Package.

U.S. Appl. No. 10/205,883, filed Jul. 25, 2002, Adrian Ong, Internally generating patterns for testing in an integrated circuit device.

U.S. Appl. No. 09/681,053, filed Dec. 12, 2000, Mahadev S. Kolluru, Embedded memory architecture for video applications.

U.S. Appl. No. 11/744,815, filed May 4, 2007, Adrian Ong, Integrated Circuit Testing Module Including Multiplexed Inputs.

* cited by examiner

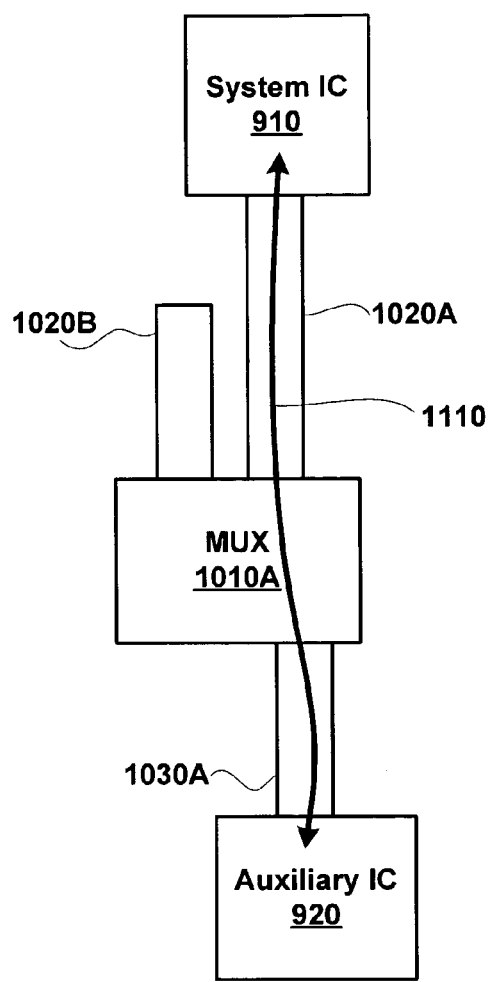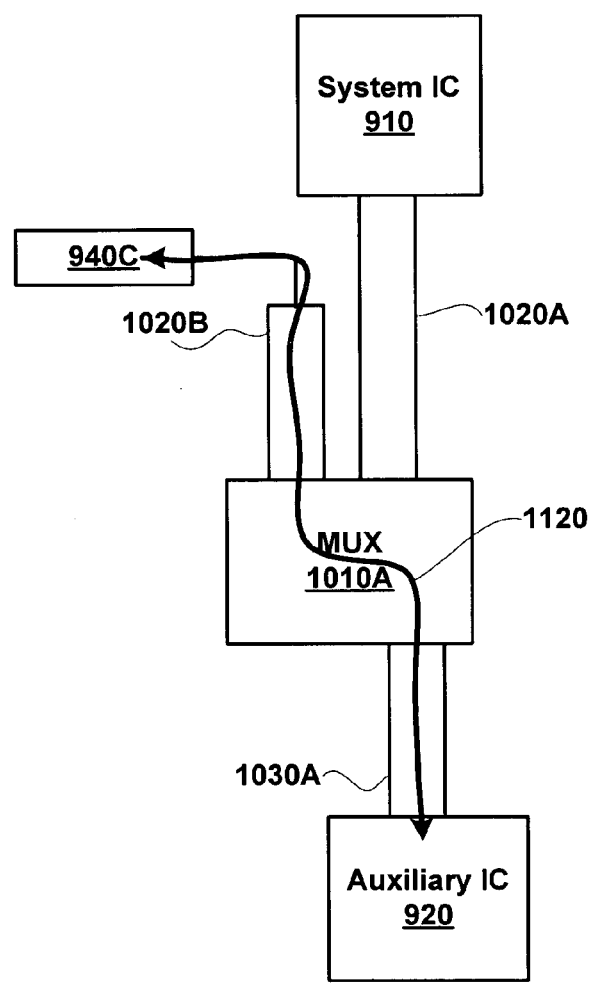
FIG. 11A
FIG. 11B

ELECTRONIC DEVICE HAVING AN INTERFACE SUPPORTED TESTING MODE

CROSS-REFERENCE TO RELATED APPLICATIONS

This application is a continuation-in-part of and claims the benefit of and priority to, co-pending U.S. patent application Ser. No. 11/108,385, now U.S. Pat. No. 7,259,582, filed on Apr. 18, 2005, entitled "Bonding pads for testing of a semiconductor device," which is a divisional of Ser. No. 10/608,613 U.S. Pat. No. 6,882,171 filed on Jun. 27, 2003 and entitled "Bonding pads for testing of a semiconductor device," which is a continuation-in-part of Ser. No. 10/305,635, U.S. Pat. No. 6,812,726, filed on Nov. 27, 2002, entitled "Entering Test Mode and Accessing of a Packaged Semiconductor Device," this application is also a continuation-in-part of, and claims the benefit of priority to, U.S. patent application Ser. No. 10/679,673, filed on Oct. 3, 2003, now U.S. Pat. No. 7,006,940 entitled "Set up for a first integrated circuit chip to allow for testing of a co-packaged second integrated circuit chip." The disclosures of all of the above U.S. patents and patent applications are hereby incorporated herein by reference.

TECHNICAL FIELD OF THE INVENTION

The invention relates generally to the field of integrated circuits, and more particularly, to systems and methods of testing integrated circuit systems.

BACKGROUND

A semiconductor or integrated circuit (IC) device may comprise many miniaturized circuits implemented in a semiconductor substrate. IC devices must be tested in order to ensure proper operation before they are used. IC devices can be tested in a limited fashion using built-in self test (BIST) circuitry that is implemented within the IC devices themselves. BIST testing however, is incomplete and does not test all aspects of operation. Thorough testing of an IC device is accomplished with complex external testing equipment. In order for complex test equipment to be used, many dedicated input/output (I/O) pins are typically required for allowing the test equipment to input various test patterns, codes, and data, and to stress the circuitry of the IC device. In an environment where multiple IC devices are combined within a single package having a limited number of input/output leads, however, it can be difficult if not impossible to use external testing equipment for testing one or more of the devices thoroughly. Often, the addition of dedicated testing pins is impractical.

SUMMARY

According to one embodiment of the present invention, a system is provided for testing a first integrated circuit chip to be packaged along with at least a second integrated circuit chip in a semiconductor device, wherein at least some external terminals for the semiconductor device are to be shared by the first and second integrated circuit chips, and wherein the first integrated circuit chip is designed for normal operation and a test mode. The system includes a plurality of test buffer multiplexer circuits. Each test buffer multiplexer circuit is operable to receive a respective signal from the second integrated circuit chip when the first integrated circuit chip is in normal operation. Each test buffer multiplexer circuit is further operable to receive a respective signal from either the second integrated circuit chip or an associated external terminal when the first integrated circuit chip is in test mode. An external terminal of the semiconductor device operable to receive a signal for causing the first integrated circuit chip to transition between normal operation and the test mode.

According to another embodiment of the present invention, a memory chip is provided for packaging along with at least a system chip in a semiconductor device, wherein at least some external terminals for the semiconductor device are to be shared by the memory chip and the system chip, and wherein the memory chip is designed for normal operation and a test mode. The memory chip includes a plurality of test buffer multiplexer circuits. Each test buffer multiplexer circuit is operable to receive a respective signal from the system chip when the memory chip is in normal operation, and is further operable to receive a respective signal from an associated external terminal when the memory chip is in test mode. A test input control buffer circuit is operable to receive a signal for causing the memory chip to transition between normal operation and the test mode.

According to yet another embodiment of the present invention, a method is provided for testing a first integrated circuit chip packaged along with at least a second integrated circuit chip in a semiconductor device, wherein at least some external terminals for the semiconductor device are shared by the first and second integrated circuit chips, and wherein the first integrated circuit chip is designed for normal operation and test mode. The method includes: transitioning the first integrated circuit chip from normal operation into the test mode; programming test codes in the first integrated circuit chip; and operating the first integrated circuit chip according to the programming codes and using test addresses and test patterns.

According to yet another embodiment of the present invention, a system is provided for testing a first integrated circuit chip to be packaged along with at least a second integrated circuit chip in a semiconductor device, the first integrated circuit chip may comprise a logic device, wherein at least some external terminals for the semiconductor device are to be shared by the first and second integrated circuit chips, wherein the first integrated circuit chip is designed for normal operation and a test mode, the system comprising a plurality of test buffer multiplexer circuits, each test buffer multiplexer circuit operable to receive a respective signal from the second integrated circuit chip when the first integrated circuit chip is in normal operation, each test buffer multiplexer circuit operable to receive a respective signal from either the second integrated circuit chip or an associated external terminal when the first integrated circuit chip is in test mode, and an external terminal of the semiconductor device operable to receive a signal for causing the first integrated circuit chip to transition between normal operation and the test mode.

Various embodiments of the invention include a system comprising a first integrated circuit configured to operate in at least a normal mode and a test mode, a second integrated circuit, both the first integrated circuit and the second integrated circuit being disposed within the same semiconductor device package, a first terminal external to the semiconductor device package, electronically coupled to the first integrated circuit and the second integrated circuit, and configured to receive a first signal for use by the first integrated circuit and to receive a second signal for use by the second integrated circuit, and at least one multiplexer circuit, the multiplexer circuit configured to receive the second signal from the first terminal and to convey the second signal for use by the second integrated circuit when the first integrated circuit chip is in the normal mode, and configured to receive the first signal from the first terminal and to convey the first signal to the first-integrated circuit in the test mode.

Various embodiments of the invention include a system comprising a logic device configured to operate in at least a normal mode and a test mode, an integrated circuit, both the logic device and the integrated circuit being disposed within the same semiconductor device package, a first terminal external to the semiconductor device package, electronically coupled to the logic device and the integrated circuit, and configured to operate as a shared input for the logic device and the integrated circuit, a multiplexer circuit operable to communicate a first signal from the integrated circuit to the logic device in the normal mode, and operable to communicate a second signal from the first terminal to the logic device in test mode, and a second terminal external to the semiconductor device package configured to receive a third signal for causing a transition between the normal mode and the test mode.

Various embodiments of the invention include a system comprising a first integrated circuit configured to operate in at least a normal mode and a test mode, a second integrated circuit, both the first integrated circuit and the second integrated circuit being disposed within the same semiconductor device package, shared means for receiving at the first integrated circuit a signal from the second integrated circuit when the first integrated circuit is in the normal mode, and for receiving at the first integrated circuit a signal from a terminal external to the semiconductor device package when the first integrated circuit is in test mode, and means for causing the first integrated circuit to transition between the normal mode and the test mode.

Various embodiments of the invention include a semiconductor device comprising a first chip, a second chip configured to operate in a normal mode and a test mode, the second chip including at least a memory chip or a logic device, a semiconductor device package including the first chip and the second chip, one or more input terminals shared by the first chip and the second chip, at least part of each of the one or more input terminals being external to the semiconductor device package, a plurality of multiplexer circuits, each multiplexer circuit operable to receive a respective signal from the first chip when the second chip is in the normal operation mode, each multiplexer circuit operable to receive a respective signal from a respective member of the one or more input terminals when the first chip is in the test mode, and a test input control buffer circuit configured to receive a signal for causing the second chip to transition between the normal mode and the test mode.

Various embodiments of the invention include an electronic device comprising a plurality of connectors configured for communicating electronic signals between the electronic device and devices external to the electronic device, a system integrated circuit configured to receive and use electronic signals from at least a first member of the plurality of connectors, an auxiliary integrated circuit configured to be tested when the electronic device operates in a testing mode and to operate normally when the electronic device operates in a normal mode, and an interface including one or more multiplexer circuit each configured to convey electronic signals between the system integrated circuit and the auxiliary integrated circuit when the electronic device operates in the normal mode, and to convey electronic signals between the first member of the plurality of connectors and the auxiliary integrated circuit when the electronic device operates in the testing mode.

Various embodiments of the invention include a method of operating an electronic device, the method comprising operating the electronic device in a normal mode, the normal mode including communicating a first signal from a device external to the electronic device through a first electrical connector to a system integrated circuit disposed within the electronic device, and communicating a second signal from the system integrated circuit through an interface to an auxiliary integrated circuit, the first electrical connector being shared by the system integrated circuit and the interface, applying a third signal from a device external to the electronic device to a second electrical connector, the third signal being configured to change the state of a multiplexer circuit within the interface such that the electronic device is operable in a test mode, and operating the electronic device in the test mode, the test mode including communicating a fourth signal from a device external to the electronic device through the first electrical connector to the auxiliary integrated circuit via the interface, the test mode being configured for testing the auxiliary integrated circuit.

Important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which:

FIGS. 11A and 11B illustrate bi-directional signal paths through a MUX, according to various embodiments of the invention.

DETAILED DESCRIPTION

The embodiments of the present invention and their advantages are best understood by referring to FIGS. 1 through 20 of the drawings. Like numerals are used for like and corresponding parts of the various drawings.

Semiconductor Devices

Figure 1A:
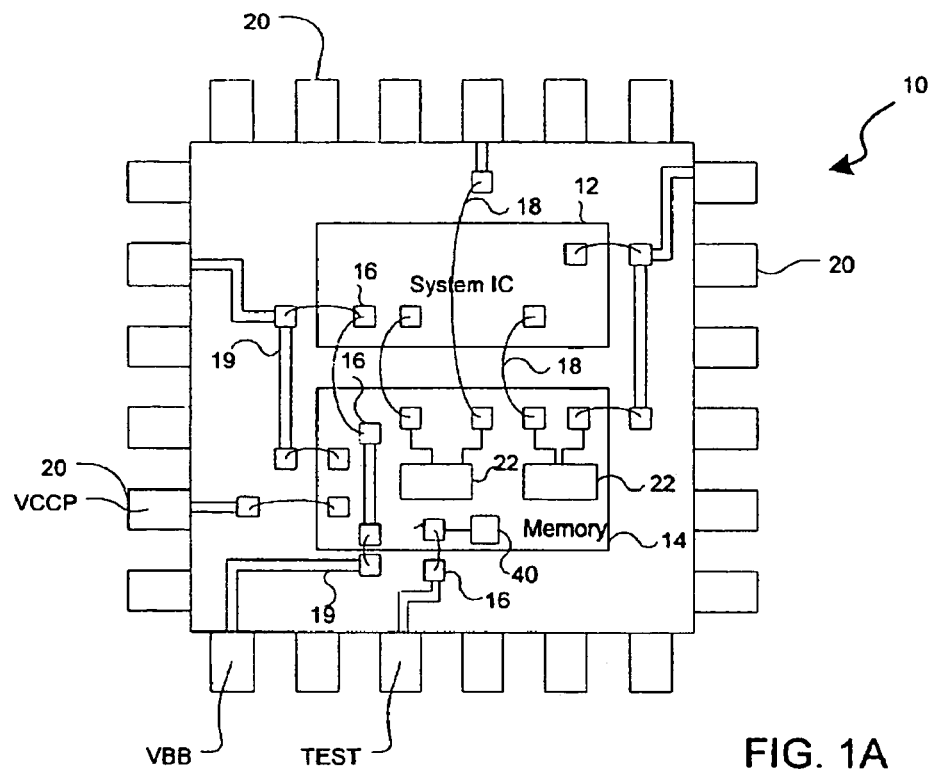
FIG. 1A is a block diagram of an exemplary semiconductor device, according to an embodiment of the present invention.
Figure 1B:
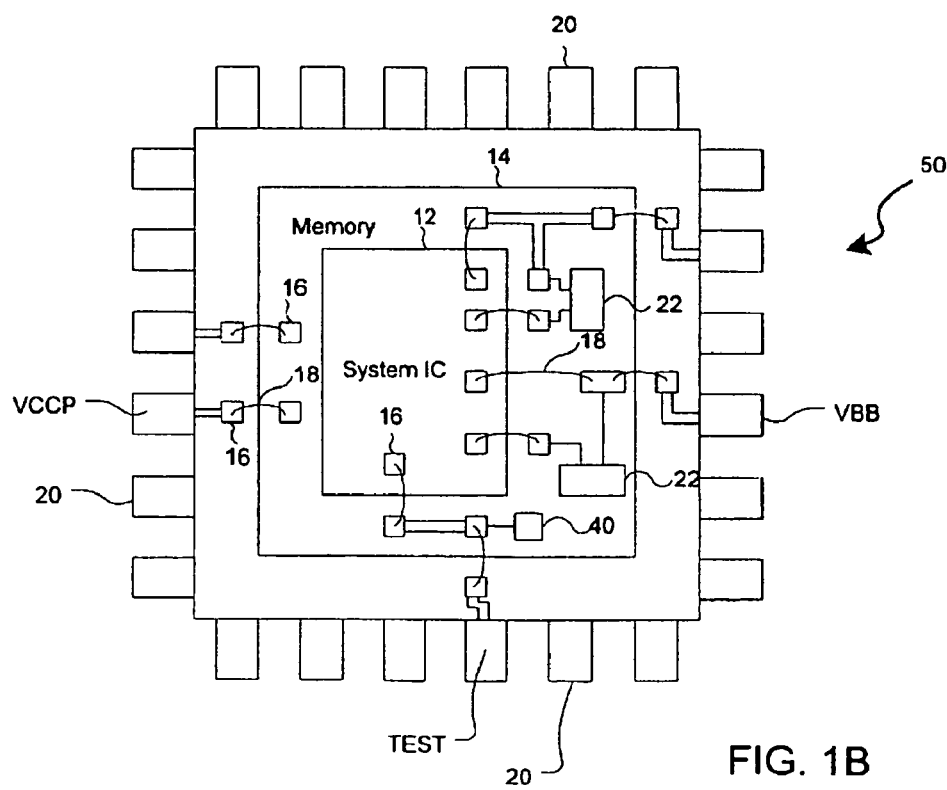
FIG. 1B is a block diagram of another exemplary semiconductor device, according to an embodiment of the present invention.

FIGS. 1A and 1B illustrate exemplary semiconductor devices 10 and 50 in which systems and methods, according to various embodiments of the invention, can be incorporated and used. Semiconductor devices 10 and 50 represent any type of integrated circuit (IC) device (also referred to herein as a packaged device) that may require testing, such as, for example, by external automated test equipment or an integrated circuit tester. Each of semiconductor devices 10 and 50 can be packaged as a standard ball grid array (BGA) or thin quad flatpack (TQFP) having 144 pins or more. However, other types of packaging may be used. For example, the packaging may have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

FIG. 1A is a block diagram of an exemplary semiconductor device 10, according to an embodiment of the present invention. As depicted, semiconductor device 10 may comprise a system integrated circuit (IC) 12 and a memory 14. Each of system IC 12 and memory 14 can be implemented in a separate semiconductor die (commonly referred to as a "chip"). Each die is a monolithic structure formed from, for example, silicon or other suitable material. Accordingly, semiconductor device 10 can be referred to as a "multi-chip module" (MCM).

System IC 12 can be a chip with logic circuitry, such as, for example, an application specific integrated circuit (ASIC), a processor, a microprocessor, a microcontroller, a field programmable gate array (FPGA), programmable logic device (PLD), complex programmable logic device (CPLD), or other logic device. Memory 14 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory. As noted in U.S. application Ser. No. 09/967,389 entitled "Testing of Integrated Circuit Devices," filed on Sep. 28, 2001, (assigned to the same assignee and incorporated by reference herein in its entirety), the chip configured to be tested may include other types of devices in addition to or instead of Memory 14. Thus, the teachings herein relating to Memory 14 may be alternatively applied to logic chips, such as gate arrays or programmable logic devices, and processor or specialized chips, such as an application specific integrated circuit (ASIC), a microprocessor, a microcontroller, a digital signal processor (DSP), or the like.

System IC 12 and memory 14 may work in conjunction. Memory 14 provides storage capability for data/information that is provided from system IC 12 or some other components. System IC 12 provides processing capability for operating on data/information, and may retrieve information from and store information into memory 14. In normal operation for semiconductor device 10, signals for data/information may be received by memory 14 from system IC 12.

System IC 12 and memory 14 may each comprise one or more bonding pads 16, which can be connected via, for example, bonding wires 18, to provide communication between the chips and/or other components within or external to semiconductor device 10. As used herein, the terms "connected," "coupled," or any variant thereof, means any connection or coupling, either direct or indirect, between two or more elements. For clarity, in FIG. 1A, only a portion of the bonding pads 16 and bonding wires 18 are provided with reference numerals. At least some of the bonding pads 16 and bonding wires 18 may support communication directly between system IC 12 and memory 14.

In one embodiment, system IC 12 and memory 14 may be mounted in a side-by-side arrangement on a printed circuit board (PCB) substrate, such as for a multi-chip package (MCP). Such PCB substrate may also have bonding pads 16 and traces 19. In one embodiment, at least some traces 19 formed on either memory 14 or system IC 12 may be used for pin-out for the other chip.

As shown, semiconductor device 10 includes a number of external terminals 20 which can be, for example, input/output (I/O) leads or pins. For clarity, in FIG. 1A, only some of the external terminals 20 are provided with reference numerals. In general, these external terminals 20 enable the components within semiconductor device 10 to exchange data/information with components external to the semiconductor device 10. In one embodiment, one or more of these external terminals 20 are connected to and serve both the system IC 12 and memory 14. That is, an external terminal 20 which provides I/O capability for the system IC 12 may also provide I/O capability for memory 14.

To verify that semiconductor device 10 is operating properly, the components contained therein should be thoroughly tested. For this purpose, in one embodiment, memory 14 may receive signals from test equipment that is external to the semiconductor device 10. One or more test buffer multiplexer circuits 22 may be provided or incorporated in memory 14. Each multiplexer circuit 22 generally functions to multiplex between signals that are generated in normal operation of semiconductor device 10 and signals that are generated for testing of semiconductor device 10. The signals generated in normal operation may originate from system IC 12, whereas the signals for testing may originate from external test equipment.

Memory 14 may also comprise an on-chip sequence pattern generator, such as that described in related U.S. application Ser. No. 10/205,883 entitled "Internally Generating Patterns For Testing In An Integrated Circuit Device," filed on Jul. 25, 2002, assigned to the same assignee and incorporated by reference herein in its entirety. Such pattern generator may comprise a test column address counter and a test row address counter. The test column address counter may increment independently of the test row address counter. The address counters may function to internally generate sequences of numbers for use as addresses during testing.

If memory 14 were packaged as a discrete component (i.e., separate from system IC 12), thorough testing of the memory would require full access to all data, control, and access points of memory 14 so that complete test patterns could be input and extracted from the memory 14. However, since memory 14 is packaged with system IC 12 in semiconductor device 10 and various access points of memory 14 are connected to system IC 12 for normal operation, test buffer multiplexer circuits 22 enable full access to memory 14 by multiplexing between signals from system IC 12 in normal operation and signals from external test equipment during testing. In this way, the external terminals 20 which are shared between the memory 14 and system IC 12 can emulate test pins which would be dedicated if memory 14 were packaged separately.

In one embodiment, the signals which are multiplexed can be clock enable (CKE), chip select (CS), row address strobe (RAS), column address strobe (CAS), write enable (WE), data read/write mask (DQM), bank select (BA), all row precharge (AP), bi-directional test data I/O (TD), set (SET), and load (LOAD), and respective testing counterparts for the same. It should be understood, that in other embodiments, signals in addition to or other than one or more of those described immediately above may be multiplexed.

In addition, one or more external terminals 20 may be dedicated (i.e., not shared between system IC 12 and memory 14) for testing of memory 14. In one embodiment, these dedicated external terminals 20 can receive signals for test (TEST), analog word-line voltage (VCCP), and analog memory substrate voltage (VBB). The TEST signal generally functions to put memory 14 into the test mode. The VCCP and VBB signals are used for stressing the memory 14 by providing voltage levels significantly above or below VDD and VSS. In another embodiment, only one external terminal 20—i.e., the one for the TEST signal—is dedicated for the testing of memory 14, and the signals for VCCP and VBB are generated internally within memory 14. This reduces the number of external terminals 20 for the semiconductor device 10. In yet another embodiment, the external terminal 20 which receives the TEST signal may be shared between the memory 14 and system IC 12. In such case, a voltage level which differs from the voltage levels used in normal operation is applied to the external terminal 20 to put the memory 14 into test mode, as discussed herein in more detail.

Semiconductor device 10 can work in normal operation or be placed in testing mode. In normal operation, system IC 12 and memory 14 may cooperate to receive, process, store, and output data and information. In testing mode, one or both of system IC 12 and memory 14 may be functionally tested to verify proper operation. With embodiments of the present invention, memory 14 can be tested completely separately from system IC 12.

In one embodiment, semiconductor device 10 (and in particular, memory 14) can be placed in testing mode with various control signals, such as, for example, the TEST, SET and LOAD signals. Memory 14 may include a test input control buffer circuit 40, which generally functions to receive and buffer control signals for programming of the memory 14. In some embodiments, the TEST signal is made a high value (or "1", such as VDD) and remains high throughout in-package testing. The SET and LOAD signals are initially at a low value (or "0", such as GND). Then the SET and LOAD signals are pulsed high for predetermined periods (e.g., 10 ns) to enable test buffer multiplexer circuits 22 on memory 14. The semiconductor device 10 is now in test mode.

In test mode, there may be two phases: a programming phase and an access phase. In the programming phase, the memory 14 can be set up or programmed for testing. This set up can include, for example, loading test addresses and sequential test data patterns (or codes) into various parts of the memory 14 (e.g., row and column test counters). In one embodiment, one or more test data (TDQ) signals may be used to program test modes, load test addresses, load test vectors, and load test patterns. The SET and LOAD signals can be used to enable test addresses or vectors to be set and loaded. An exemplary timing diagram illustrating the pulses for SET and LOAD signals to program a code in memory 14 is shown and described with reference to FIG. 8 below. All test mode programming can be performed asynchronously (i.e., no clock is required). In one embodiment, a test control (TCNT) is set to a high value ("1") to cause the memory 14 to exit the programming phase and enter the access phase. New test addresses and vectors can no longer be programmed.

In the access phase, the memory 14 is actually operated using the test addresses and test patterns. In one embodiment, all external and burst counter addresses are ignored by memory 14 while in access phase. The memory 14 only recognizes the addresses from the programmed row and column test counters. The TDQ signals are now used to read and write data to memory 14. A test stop row (TSR) counter signal may be used to stop the row address counter, and a test stop column (TSC) counter signal may be used to stop the column address counter while in access phase. This allows independent incrementation (or decrementation) of row and column addresses. Both the TSR and TSC counter signals may be independent of the CLK signal. In general, with some embodiments, programming of memory 14 during testing can be asynchronous. In other embodiments or as an option, programming can be synchronous for memory 14. Also, during access phase, the memory 14 may operate synchronously or asynchronously, depending on the memory specification.

To exit test mode, in one embodiment, the TEST signal is brought to a low value ("0"), which clears all test operations and disables the test input buffers.

With the systems and methods, according to various embodiments of the invention, an IC chip (e.g., memory 14) which is packaged along with one or more other chips (e.g., system IC 12) can be fully tested without requiring a significant number of dedicated I/O terminals. Control signals from complex external test equipment (e.g., a standard external memory tester) can be provided to all data, control, and access pads of the desired IC chip for thorough and complete testing using a variety of test patterns and sequences. These embodiments provide complete and flexible testing of IC devices.

In some embodiments, the systems and methods described herein can be used in conjunction with the systems and methods described in related U.S. application Ser. No. 09/666,208 entitled "Chip Testing Within a Multi-Chip Semiconductor Package," filed on Sep. 21, 2000, assigned to the same assignee and incorporated by reference herein in its entirety.

FIG. 1B is a block diagram of another exemplary semiconductor device 50, according to an embodiment of the present invention. Semiconductor device 50 can be similar in many respects to semiconductor device 10 depicted in FIG. 1A. That is, semiconductor device 50 may comprise a system IC 12 and a memory 14 (each with bonding pads 16 provided thereon), and external terminals 20 for communicating data/information into and out of semiconductor device 50. Memory 14 receives signals from system IC 12. Furthermore, memory 14 may comprise one or more test buffer multiplexer circuits 22 for enabling multiplexing between signals generated in normal operation and signals generated for testing, thereby allowing memory 14 to be thoroughly tested with external test equipment.

In semiconductor device 50, system IC 12 and a memory 14 are provided in stacked arrangement. In this arrangement, system IC 12 may be attached to memory 14 using, for example, any suitable adhesive. Traces 19 may be formed on memory 14 for pin-out for system IC 12. Furthermore, although not depicted, some traces 19 may be formed on system IC 12 for pin-out for memory 14.

In one embodiment, one or both of the test analog voltages (i.e., word-line voltage (VCCP) and analog memory substrate voltage (VBB)) can be multiplexed with voltages used in normal operation. For this, respective test buffer multiplexer circuits 22 may be provided or incorporated in memory 14.

Test Buffer Multiplexer Circuit

Figure 2A:
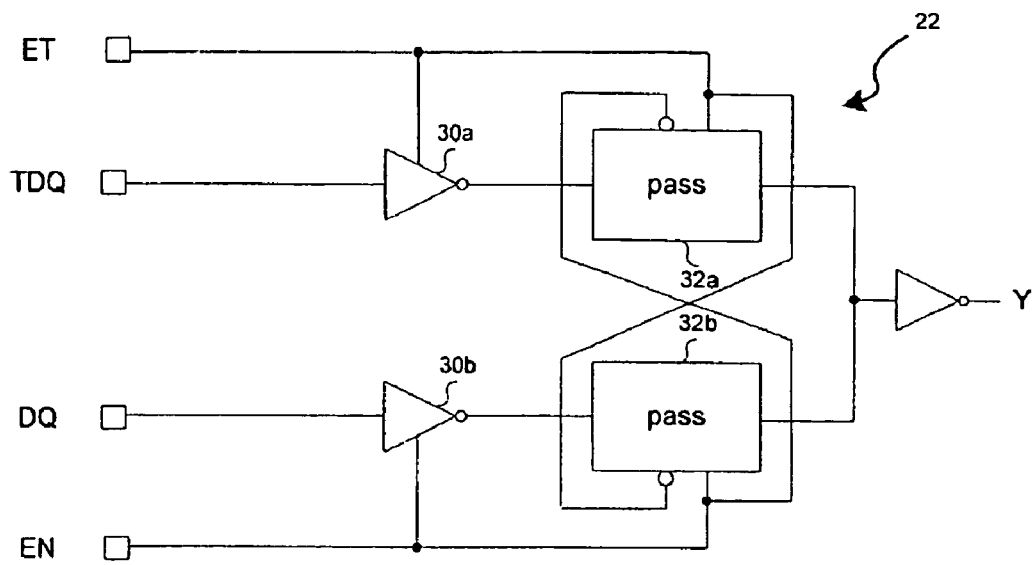
FIG. 2A is a schematic diagram of an exemplary implementation of a test buffer multiplexer circuit, according to an embodiment of the present invention.

FIG. 2A is a schematic diagram of an exemplary implementation of a test buffer multiplexer circuit 22, according to an embodiment of the present invention. Test buffer multiplexer circuit 22 may be implemented or incorporated in a memory 14 to support the testing thereof. In this embodiment, as depicted, test buffer multiplexer circuit 22 comprises buffer circuits 30a, 30b and pass gate circuits 32a, 32b.

Figure 3:
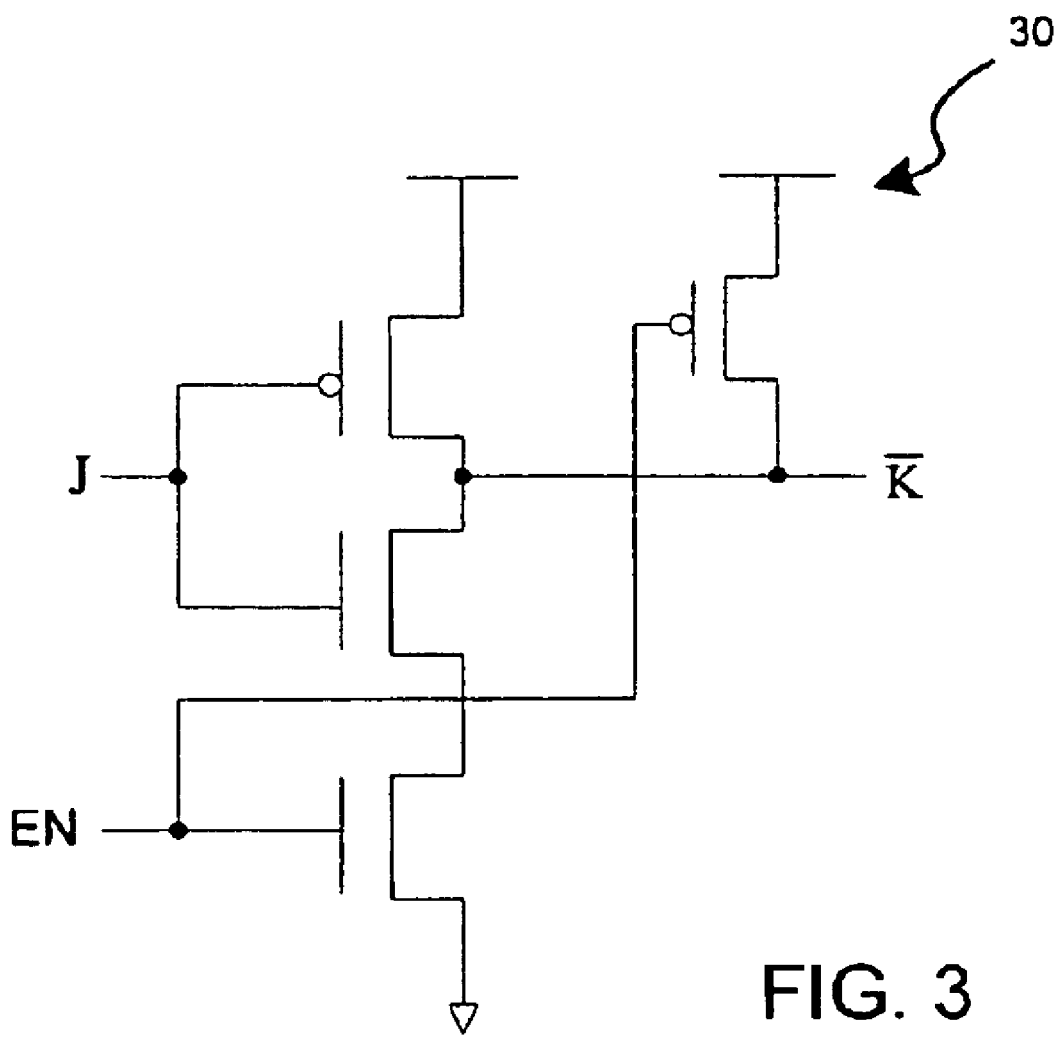
FIG. 3 is a schematic diagram of an exemplary implementation of an input buffer circuit.

One buffer circuit 30b may be connected to receive a signal (e.g., data (DQ)) from system IC 12, while the other buffer circuit 30a may be connected to receive a corresponding test signal (e.g., test data (TDQ)) from a testing machine via an external terminal 20. Buffer circuit 30a is enabled by an enable test (ET) signal, while buffer circuit 30b is enabled with an enable normal (EN) signal. The ET and the EN signals can be complementary signals, and may both be supported by the same external pin or lead which, for example, receives the TEST signal. This external pin can be either dedicated for receiving the TEST signal to the place the memory 14 in test mode, or alternatively, shared between the memory 14 and a system IC 12. An exemplary implementation of a buffer circuit 30 is depicted in FIG. 3.

Pass gate circuit 32a is coupled at its input to receive the output of buffer circuit 30a. Pass gate circuit 32b is coupled at its input to receive the output of buffer circuit 30b. Both pass gate circuits 32a, and 32b receive the enable test and enable normal signals. Each pass gate circuit 32a, and 32b generally functions to pass the value of a signal appearing at its input as the value of its output signal upon a particular combination of values for the enable test and enable normal signals. For example, in one embodiment, when the enable test signal has a high value (or "1") and the enable normal has a low value (or "0"), then the value of the output signal from buffer circuit 30a appears at output Y for the test buffer multiplexer circuit 22. An exemplary implementation of a pass gate circuit is described in related U.S. application Ser. No. 09/967,389 entitled "Testing of Integrated Circuit Devices," filed on Sep. 28, 2001, assigned to the same assignee and incorporated by reference herein in its entirety.

Although only a single test buffer multiplexer circuit 22 is depicted in FIG. 2A for the data signal and its counterpart test signal, it should be understood that a plurality of test buffer multiplexer circuits 22 may be provided on a memory 14 for multiplexing various other signals from a system IC 12 (e.g., CLK, CKE, CS, RAS, CAS, WE, DQM, BA, and AP) and their counterpart test signals (e.g., TCLK, TCKE, TCS, TRAS, TCAS, TWE, TDQM, TBA, and TAP).

In operation, when the memory 14 on which test buffer multiplexer circuit 22 is implemented is in normal operation, then the value of the signal from the system IC 12 is buffered and passed as the output Y of the multiplexer circuit 22. Alternatively, when the memory 14 is placed in test mode, then the value of signal from external testing equipment (e.g., TDQ) is buffered and passed as the output Y of the multiplexer circuit 22.

Figure 2B:
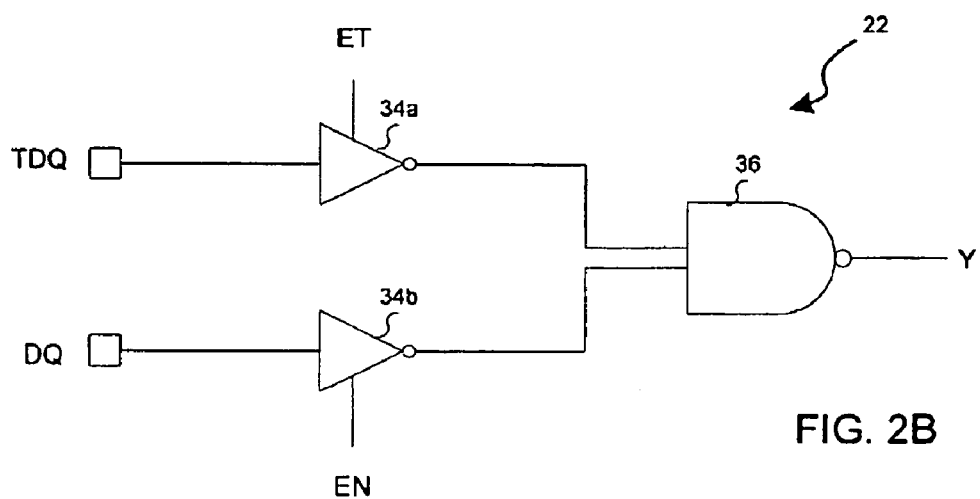
FIG. 2B is a schematic diagram of another exemplary implementation of a test buffer multiplexer circuit, according to an embodiment of the present invention.

FIG. 2B is a schematic diagram of another exemplary implementation of a test buffer multiplexer circuit 22, according to an embodiment of the present invention. In this embodiment, as depicted, test buffer multiplexer circuit 22 comprises buffer circuits 34a, 34b and NAND gate 36.

Buffer circuit 34b may be connected to receive a signal (e.g., data (DQ)) from system IC 12, and buffer circuit 34a may be connected to receive a corresponding test signal (e.g., test data (TDQ)) from a testing machine via an external terminal 20. Buffer circuits 34a and 34b are enabled by the enable test (ET) and enable normal (EN) signals, respectively. NAND gate 36 receives and performs a "NAND" operation on the outputs of buffer circuits 34a and 34b. NAND gate 36 outputs a value of the Y signal, which is the output for the multiplexer circuit 22.

As with FIG. 2A, although only a single test buffer multiplexer circuit 22 is depicted here in FIG. 2B for the data signal and its counterpart test signal, it should be understood that a plurality of test buffer multiplexer circuits 22 may be provided on a memory 14 for multiplexing various other signals from a system IC 12 and their counterpart test signals.

Figure 2C:
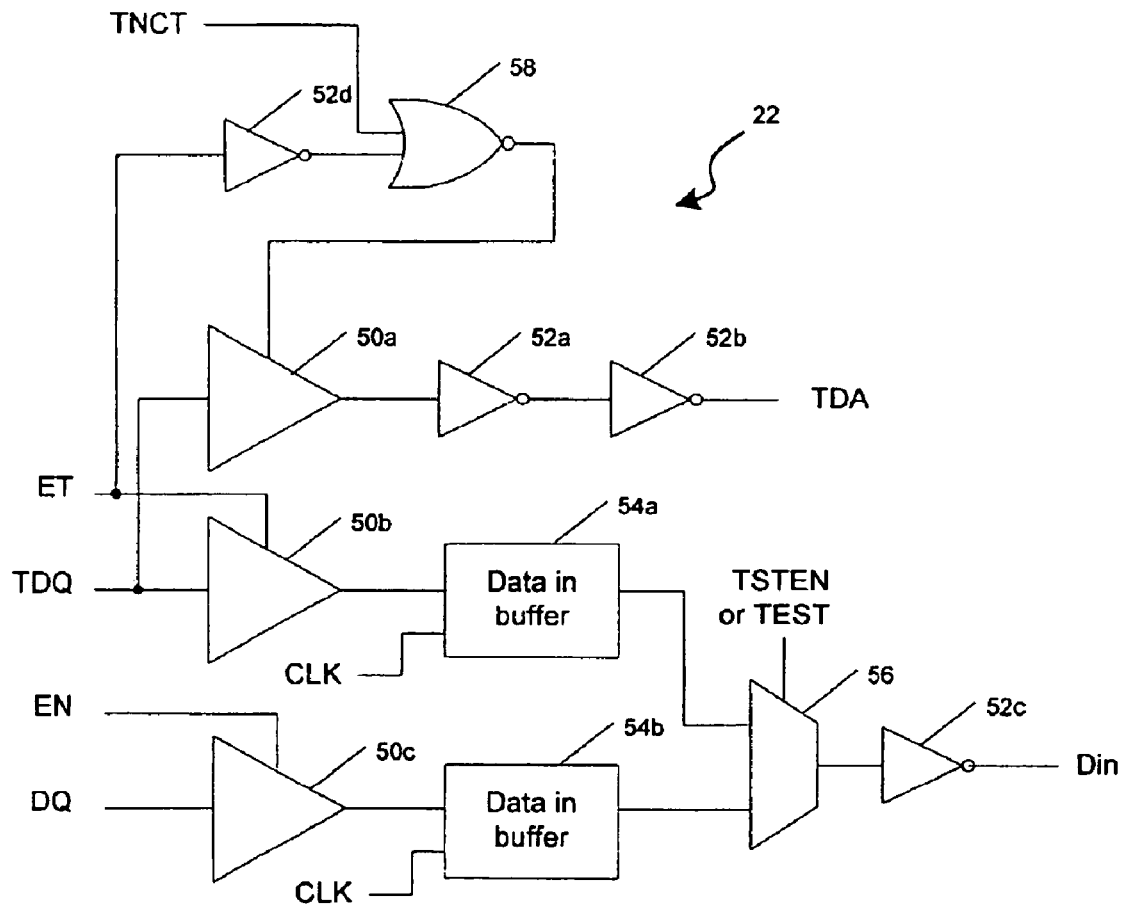
FIG. 2C is a schematic diagram of yet another exemplary implementation of a test buffer multiplexer circuit, according to an embodiment of the present invention.

FIG. 2C is a schematic diagram of yet another exemplary implementation of a test buffer multiplexer circuit 22, according to an embodiment of the present invention. In this embodiment, as depicted, test buffer multiplexer circuit 22 comprises buffer circuits 50a, 50b, 50c, inverter gates 52a, 52b, 52c, 52d, data buffers 54a, 54b, a multiplexer (MUX) 56, and a NOR gate 58.

Buffer circuit 50a and inverter gates 52a, 52b may be part of a path for inputting program code data into memory 14, for example, during a programming phase of test mode for the memory 14. Buffer circuit 50a receives a test signal (e.g., test data (TDQ)) from an external test machine. Buffer circuit 50a can be enabled by a signal that is derived from logic operations on the enable test (ET) and a test control or test counter (TCNT) signal. The output of this buffer circuit 50a and inverter gates 52a, 52b is a TDA signal for programming memory 14. In one embodiment, eight TDA signals (i.e., TDA[0:7]) may be supported for programming up to 256 test codes. Eight TDQ signals (i.e., TDQ[0:7]) may be supported as well.

In one embodiment, the TCNT signal may default to a low value upon entry into test mode. If the memory 14 is in the programming phase of test mode, the TCNT signal may have a low value. If memory 14 is in the access phase of test mode, test control (TCNT) signal may have a high value. TCNT signal may be set to a high value using the SET and LOAD (code) signals. For example, in one embodiment, the TCNT signal can be set to VDD by bringing the SET signal to a high value with the values of TDQ[7:0]=00110000. The LOAD signal is used for loading registers, such as test address or test pattern.

Buffer circuit 50b and data buffer 54a may be part of a path for inputting test data into memory 14, for example, during an access phase of test mode for the memory 14. Buffer circuit 50b is enabled by the enable test (ET) signal and may receive the test data (TDQ)) from an external test machine. Data buffer 54a is connected to receive the output signal of buffer circuit 50b and a clock (CLK) signal. Data buffer 54a latches the output of buffer circuit 50b and may output the same on an edge of the CLK signal.

Buffer circuit 50c and data buffer 54b may be part of a path for inputting data into memory 14, for example, during normal operation for the memory 14. Buffer circuit 50c is enabled by the enable normal (EN) signal and may receive the data (DQ)) from system IC 12. Data buffer 54b is connected to receive the output signal of buffer circuit 50c and a clock (CLK) signal. Data buffer 54b latches the output of buffer circuit 50c and may output the same on an edge of the CLK signal.

Multiplexer 56 is connected to receive the output signals of data buffers 54a and 54b, and can be enabled with a TEST signal, a TSTEN signal, or a TCNT signal. Depending on the values of the EN and ET signals, multiplexer 56 will pass (via inverter gate 52c) either the output of data buffer 54a or the output of data buffer 54b to other circuitry on memory 14. In particular, if memory 14 is in test mode (access phase), the output of data buffer 54a is provided to the memory 14 for testing of same. If memory 14 is in normal operating mode, the output of data buffer 54a is provided to the memory 14. In other embodiments, other circuit, such as a NAND gate, can be used instead of multiplexer 56.

Test Input Control Buffer Circuits

Figure 4:
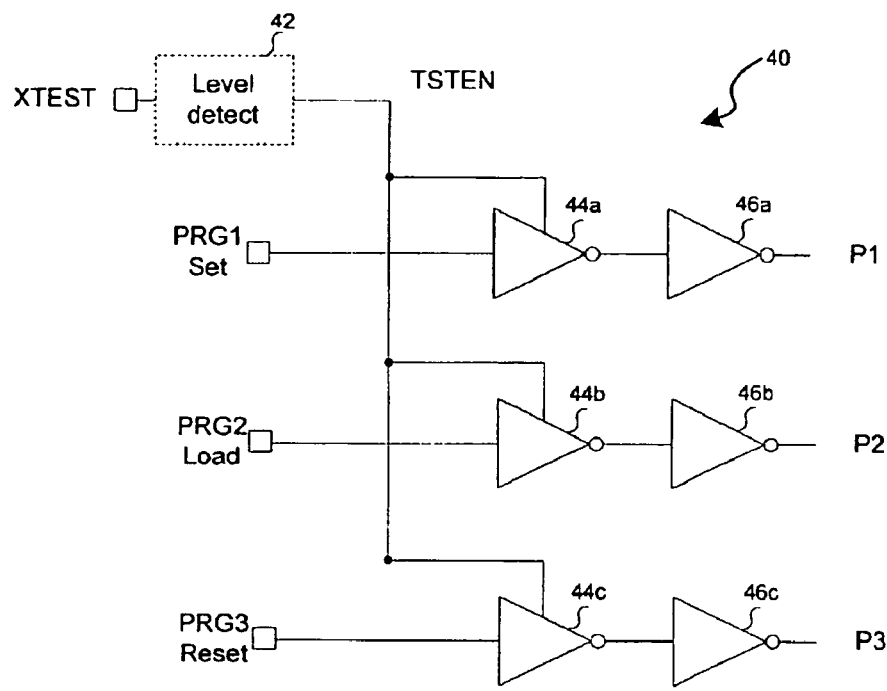
FIG. 4 is a schematic diagram of an exemplary implementation of a test input control buffer circuit, according to an embodiment of the invention.

FIG. 4 is a schematic diagram of an exemplary implementation of a test input control buffer circuit 40, according to an embodiment of the invention. Test input control buffer circuit 40 may be implemented or incorporated in a memory 14 to support the testing thereof. Test input control buffer circuit 40 generally functions to receive and buffer control signals for programming of memory 14 during the programming phase of test mode. As depicted, test input control buffer circuit 40 comprises a level detect circuit 42, input buffer circuits 44a, 44b, and 44c, and inverter gates 46a, 46b, and 46c.

Figure 5:
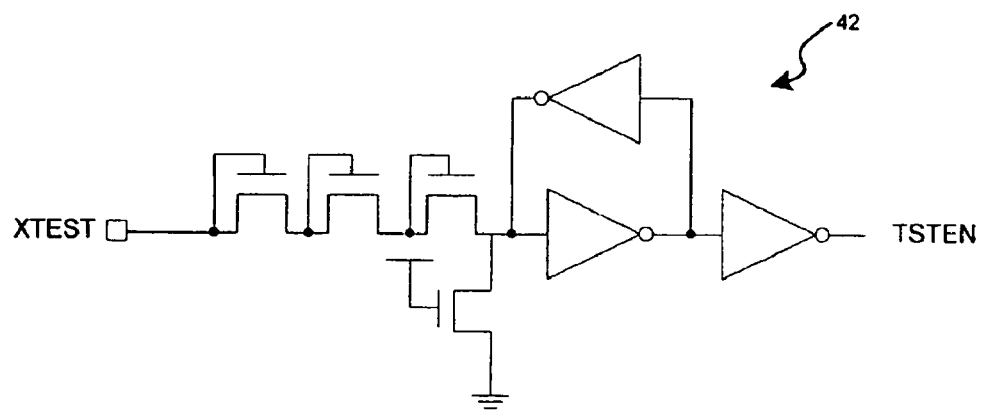
FIG. 5 is a schematic diagram of an exemplary implementation of a level detect circuit, according to an embodiment of the invention.

Level detect circuit 42 is optional and can be provided as part of test input control buffer circuit 40 when the external pin or lead for receiving the TEST signal is shared between the memory 14 and a system IC 12. In such case, because it would be undesirable to inadvertently place memory 14 into test mode during normal operation, a voltage level which differs from the voltage levels used in normal operation is used for putting the memory 14 into test mode. This voltage level can be, for example, a negative voltage (e.g., −3V) or a higher than normal voltage (e.g., 7V if VDD for memory 14 is 3.3V). Level detect circuit 42 receives the external TEST signal (XTEST) and generates an internal test enable (TSTEN) signal that is provided to each of input buffer circuits 44a, 44b, and 44c. The TSTEN signal enables input buffer circuits 44. An exemplary implementation for level detect circuit 42 is depicted in FIG. 5.

Referring again to FIG. 4, if the external pin for receiving the TEST signal is dedicated, level detect circuit 42 is not needed and thus would not be present in test input control buffer circuit 40. In this case, the external TEST signal can be applied directly to input buffer circuits 44a, 44b, and 44c. In one embodiment, for this situation, a high value for the TEST signal causes memory 14 to be in test mode, while a low value for the TEST signal takes memory 14 out of test mode.

A separate combination of input buffer circuit 44 and inverter gate 46 is provided for each of a number of programming control (PRG) signals, such as, for example, the SET, LOAD, and RESET signals. For each combination, when the input buffer circuit 44 is enabled, the respective control signal is buffered in input buffer circuit 44a, 44b, and 44c and output to the respective inverter gate 46a, 46b, and 46c where the signal is inverted. The output of each inverter gate 46a, 46b, and 46c is a respective program P signal (separately labeled P1, P2, P3). The program P signals may be provided to control the test programming of the memory 14 when it is in the programming phase of test mode. For example, these program P signals can be used to set flags and other conditions in memory 14.

It should be noted that in alternative implementations for a test input control buffer circuit 40, any number of input buffer circuits 44 and inverter gates 46, or any other suitable element could be used to support control signals that are in addition to, or instead of, the specific signals depicted in FIG. 4.

Enable Test and Enable Normal

Figure 6:
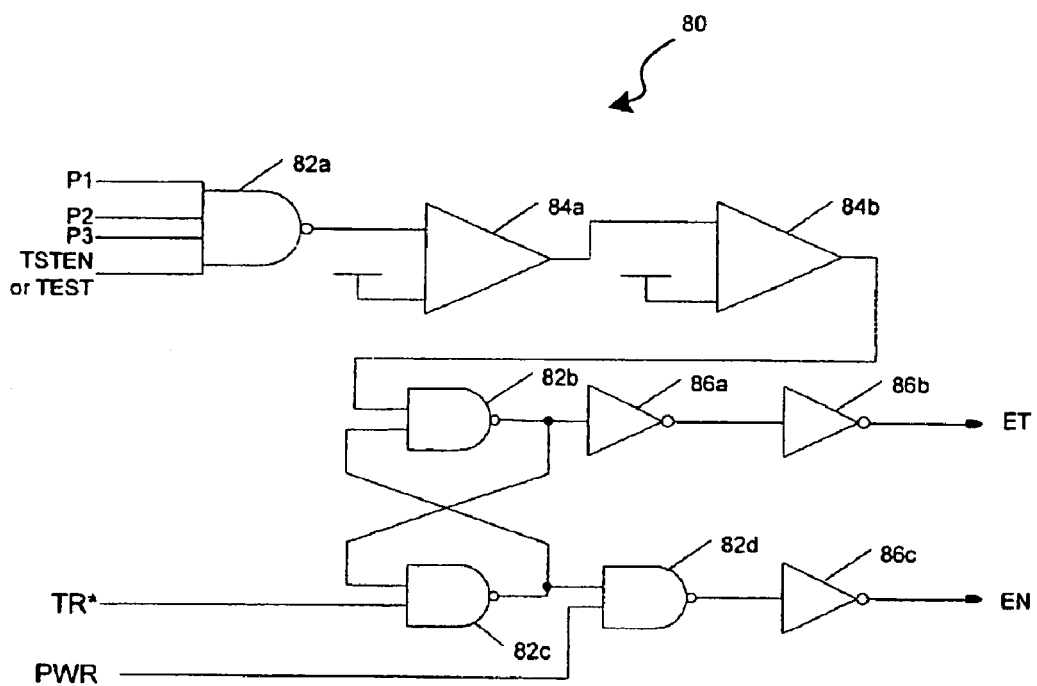
FIG. 6 is a schematic diagram of an exemplary implementation of a circuit for generating enable test and enable normal signals, according to an embodiment of the invention.

FIG. 6 is a schematic diagram of an exemplary implementation of a circuit 80 for generating the enable test (ET) and the enable normal (EN) signals, according to an embodiment of the invention. As depicted, this circuit 80 comprises NAND gates 82a, 82b, 82c, 82d, delay circuits 84a, 84b, and inverter gates 86a, 86b, and 86c.

NAND gate 82a can be connected to receive the program P and TSTEN signals from the test input control buffer circuit 40. The program P signals can be associated with or correspond to the SET, LOAD, and RESET signals. The delay circuits 84a and 84b delay the output generated by the NAND gate 82a. The delay circuits 84a and 84b may also filter noise or voltage spikes, and may prevent unintentional entry into test mode. Delay circuits 84a and 84b may be replaced with a single, larger delay circuit in alternative embodiments.

NAND gates 82b and 82c are cross-connected at one input each. The other input of NAND gate 82b is connected to receive the output of delay circuit 84b. The other input of NAND gate 82c is connected to receive a test reset (TR) signal. The test reset signal, which may be derived from a reset signal, can be used to reset an individual test mode without completely exiting test mode. Inverter gates 86a and 86b are connected to receive the output of NAND gate 82b, while NAND gate 82d and inverter gate 86c are connected to receive the output of NAND gate 82c. The output of inverter gate 86b is the enable test (ET) signal, and the output of inverter gate 86c is the enable normal (EN) signal. The ET and EN signals may be applied to the test buffer multiplexer circuit 22 (see FIGS. 2A, 2B, and 2C).

In operation, depending on the combination of values for the TSTEN and program P signals, circuit 80 will output particular values for the enable test (ET) and the enable normal (EN) signals for enabling the test or normal buffers.

Control Signal Multiplexer Circuits

Figure 7:
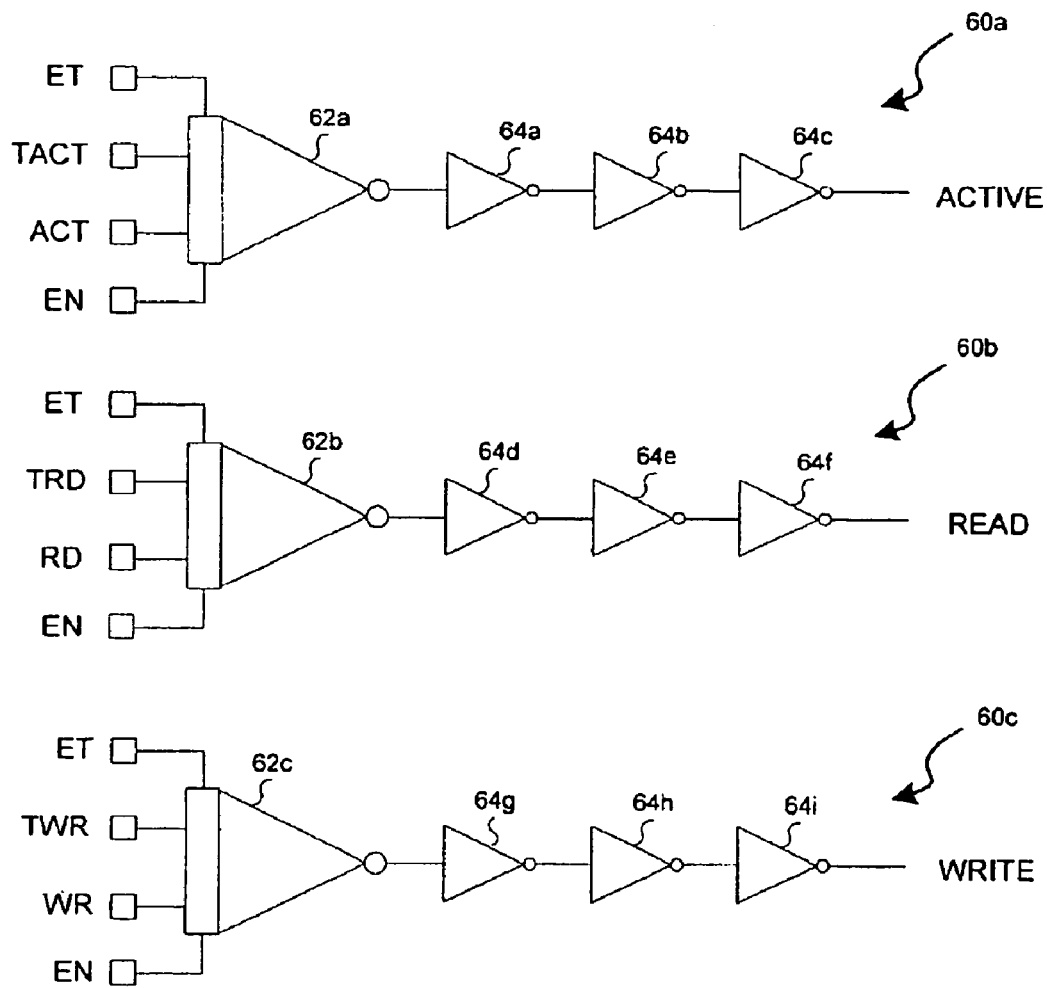
FIG. 7 is a schematic diagram of an exemplary implementation of control signal multiplexer circuits, according to an embodiment of the invention.

FIG. 7 is a schematic diagram of an exemplary implementation of control signal multiplexer circuits 60a, 60b, and 60c, according to an embodiment of the invention. Control signal multiplexer circuits 60 may be implemented or incorporated in a memory 14 to support the testing thereof.

In general, each control signal multiplexer circuit 60 functions to receive, multiplex, and buffer a control signal and its counterpart test signal. These control signals can be, for example, an active (ACT) signal, a read (RD) signal, and a write (WR) signal, and the counterpart test signals can be a test ACT (TACT), a test RD (TRD) signal, and a test WR (TWR) signal, respectively. The control signals (ACT, RD, and WR) may be received at bonding pads 16 on memory 14 which are coupled to the system IC 12. The respective counterpart test signals (TACT, TRD, and TWR) may be received at bonding pads 16 which are connected to external terminals 20 that are shared between memory 14 and system IC 12. It should be understood, that in other embodiments, control signals in addition to or other than one or more of those described immediately above may be multiplexed.

As depicted, each control signal multiplexer circuit 60 comprises a multiplex buffer 62 (separately labeled 62a, 62b, and 62c) coupled to a plurality of inverter gates 64 (separately labeled 64a through 64l).

In one embodiment, each multiplex buffer 62 can be implemented with substantially similar circuitry as, used for either of the implementations of test buffer multiplexer circuit 22 depicted in FIGS. 2A and 2B. Each multiplex buffer 62 receives an enable test (ET) signal, an enable normal (EN) signal, a respective control signal, and the counterpart test signal. During normal operation for memory 14, multiplex buffer 62 is enabled by the enable normal signal, which allows the respective control signal (e.g., ACT, RD, or WR) to be buffered and output by the multiplex buffer 62. In test mode, multiplex buffer 62 is enabled by the enable test signal, which allows the respective counterpart test signal (e.g., TACT, TRD, or TWR) to be buffered and output by the multiplex buffer 62.

The output signal from a multiplex buffer 62 is provided to the first in a respective sequence of inverter gates 64. As shown, three inventor gates 64 are provided in each sequence. The output of the last inverter gate 64 of each sequence is provided as a control signal to memory 14, for either normal operation or testing (depending on the ET and EN signals).

It should be noted that other control signal multiplexer circuits 60 may be provided to support control signals that are in addition to, or instead of, the specific signals depicted in FIG. 7.

Set and Load Sequence

Figure 8:
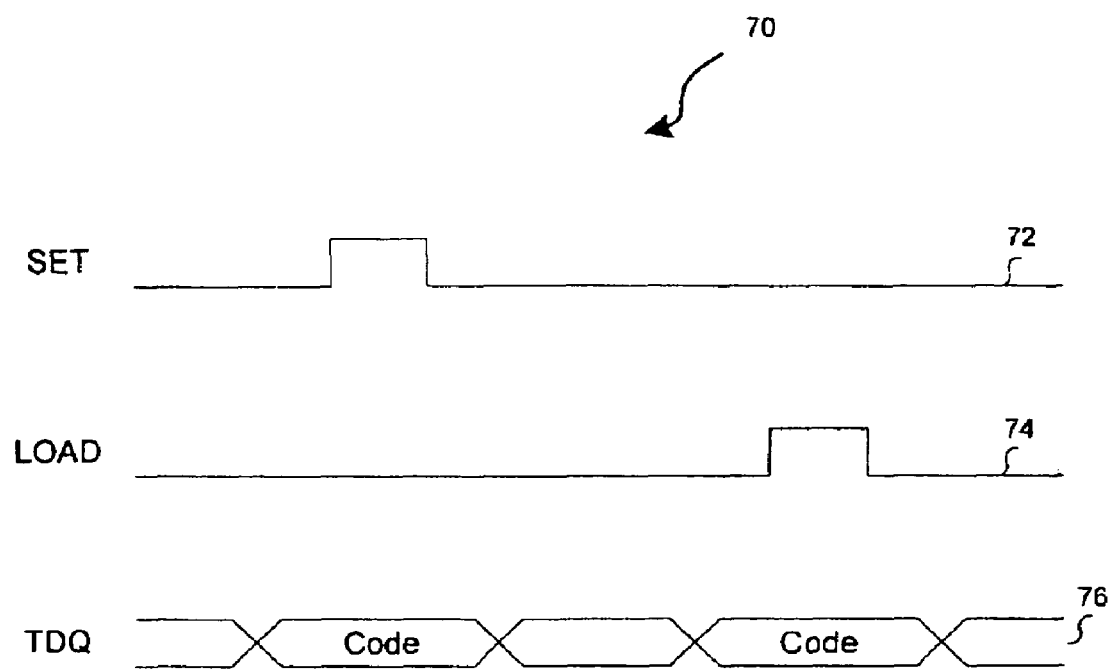
FIG. 8 is an exemplary timing diagram of a set and load sequence, according to an embodiment of the invention.

FIG. 8 is an exemplary timing diagram of a set and load sequence 70, according to an embodiment of the invention. When memory 14 is in test mode, sequence 70 can be used to load codes into memory 14 during the programming phase. In particular, in one embodiment, test modes, test patterns and test addresses may be programmed in this phase.

Referring to FIG. 8, waveforms 72, 74, and 76 are given for the SET signal, the LOAD signal, and a TDQ signal. One or more TDQ signals may be used to read and write test data, set test mode codes, load row and column addresses, program least significant bits (LSB) for row and column counters, and load test data patterns. In one embodiment, there can be eight TDQ signals: TDQ[0:7]. As the exemplary waveforms in FIG. 8 illustrate, the programming for testing memory 14 can be performed asynchronously (i.e., without a clock signal). The SET and LOAD signals are used to input codes for setting test modes and enabling test addresses or vectors to be loaded. These codes may be provided in the one or more TDQ signals. The codes can indicate or represent, for example, any of the following: no test, load row address mode, reserve, load column address mode, set row counter LSB, set/load test data background equations, all even row enable, all odd row enable, disable all pumps and regulators, disable redundant rows and columns, set column counter LSB, start test counter, load data pattern, set row counter count down, set column counter count down, and individual DQ access mode.

For example, in one embodiment, to load an initial burst column address (i.e., the starting address in a column burst counter), the following command is issued using the timing shown in FIG. 8:

SET=1 with TDQ[7:0]=00000011.→this sets the "Load Column Address" bit active (e.g., LCA=1).

LOAD=1 with TDQ[7:0]="start address" load value at TDQs to the column address counter.

For setting just a test mode (e.g., disabling a voltage regulator, setting access phase (i.e., TCNT=1), or setting 8X parallel test modes), then the SET signal in combination with valid TDQs is sufficient. In one embodiment, test modes can be persistent or non-persistent. Test modes that are non-persistent go away once a new code is programmed. Test modes that are persistent will remain in effect even after a new code is programmed.

Figure 9:
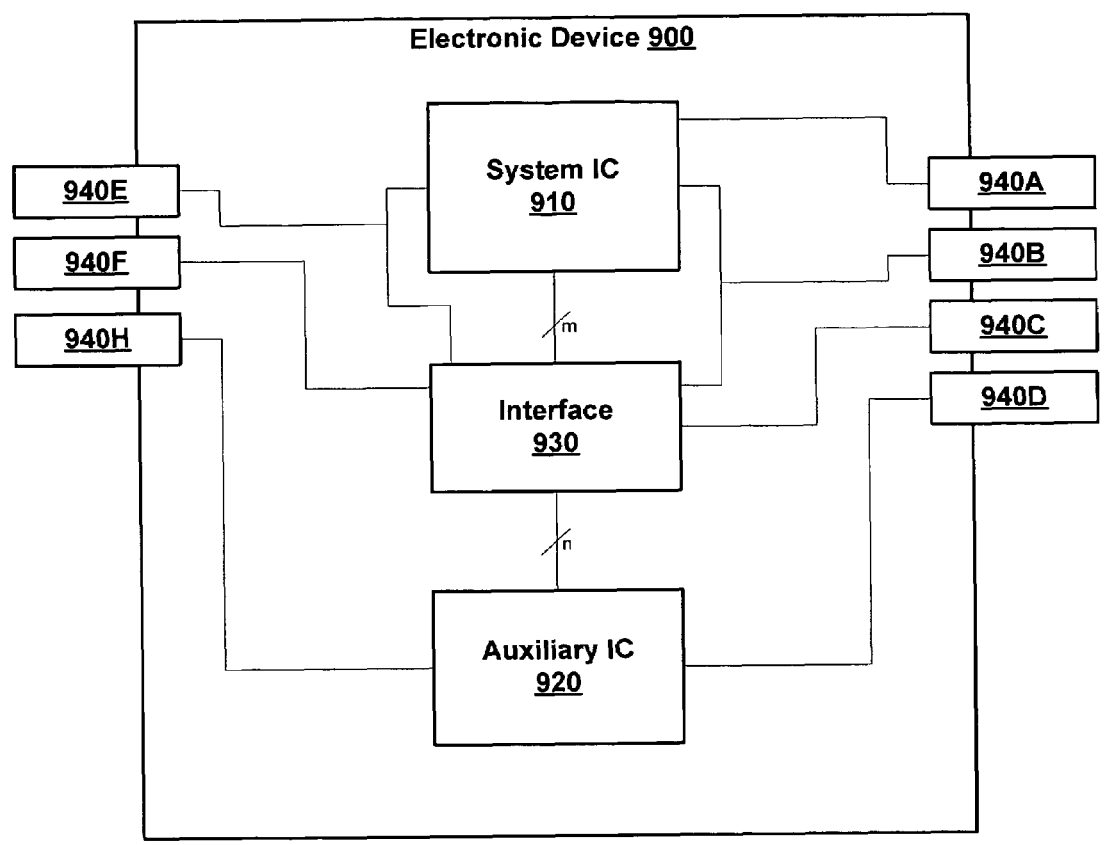
FIG. 9 is a block diagram of an exemplary device, according to various embodiments of the present invention.

FIG. 9 is a block diagram of an electronic device 900, according to various embodiments of the invention. Electronic device 900 includes a plurality of integrated circuits, such as a system IC (integrated circuit) 910, an auxiliary IC 920 and an interface 930. Electronic device 900 further includes a plurality of electrical connectors, such as electrical connectors 940A-940G. Electronic device 900 may be embodied in an electronic chip manufactured from a single wafer or semiconductor die, e.g., as a system on a chip. Alternatively, electronic device 900 may be embodied in a set of discreet electronic circuits disposed with in a single package, e.g., as a system-in-package. Alternatively, electronic device 900 may be embodied on a circuit board or circuit module, e.g. as a system-on-board or system-in-module. In these embodiments, system IC 910 and auxiliary IC 920 are optionally disposed within two or more separate individual packages. For example, in one embodiment, system IC 910 and auxiliary IC 920 are each individual chips mounted on a printed circuit board. Electrical connectors 940A-940G are external terminals 20, printed circuit board edge connectors, bus connectors, sockets, plugs, test points, terminals, pins, bond pads, soldering points, or the like, configured for conducting electronic signals and/or power between external devices and system IC 910, auxiliary IC 920, and/or interface 930.

Exemplary semiconductor devices 10 and 50 each illustrate various embodiments of electronic device 900.

Electronic device 900 is configured to operate in at least two modes, a normal mode and a test mode. The normal mode is configured for normal operation of electronic device 900, while test mode is configured for testing more or more circuits within electronic device 900. In some embodiments, one or more members of electrical connectors 940A-940G are used to communicate data to electronic device 900 in both the test mode and the normal mode.

System IC 910 can include logic circuitry, signal processing circuitry, memory, or the like. For example, system IC 910 can include system IC 12 (FIG. 1A), memory 14 (FIG. 1A), an application specific integrated circuit, a processor, a microprocessor, a microcontroller, a programmable gate array, a programmable logic device, digital signal processor, and/or the like.

Auxiliary IC 920 can include logic circuitry, signal processing circuitry, memory, and/or the like. For example, auxiliary IC 920 can include system IC 12, memory 14, an application specific integrated circuit, a processor, a microprocessor, a microcontroller, a programmable gate array, a programmable logic device, digital signal processor, and/or the like. When electronic device 900 is in the normal mode, auxiliary IC 920 is operated to perform desired functions such as processing or storing data. When electronic device 900 is in the test mode, auxiliary IC 920 is operated to undergo testing of auxiliary IC 920. Electronic device 900 optionally includes a plurality of auxiliary IC 920.

Some embodiments of the invention include hierarchical embodiments of electronic device 900. For example, auxiliary IC 920 may itself be an instance of electronic device 900. In these embodiments, a first hierarchical level includes system IC 910, interface 930, and auxiliary IC 920, for example on a printed circuit board. This instance of auxiliary IC 920 itself includes further, possibly different, instances of system IC 910, auxiliary IC 920 and interface 930, for example within a system-in-package.

System IC 910, auxiliary IC 920 and/or interface 930 are each optionally embodied in a plurality of devices. For example, in various embodiments, system IC 910 includes a plurality of logic processing chips and auxiliary IC 920 includes several memory modules and an auxiliary processor.

Electrical connectors 940A-940G are configured for communicating signals, current, voltages, digital data, power, or the like from within electronic device 900 to outside devices, and visa versa. For example, one or more members of electrical connectors 940A-940G may be configured to provide power to system IC 910 and auxiliary IC 920 from an external power source. In some embodiments, electrical connectors 940B and/or 940E are shared by system IC 910 and interface 930. I.e., electrical connectors 940B and 940E are electronically coupled to both system IC 910 and interface 930 such that a signal applied to any of electrical connectors 940B and 940E appears at respective inputs of both system IC 910 and interface 930. In typical embodiments, these electronic couplings are direct.

In various embodiments, Electrical connectors 940A-940G include at least one connector, e.g., electrical connector 940F and/or electrical connector 940C configured to change a state of interface 930, such that electronic device 900 alternatively operates in the normal mode or the test mode. Electrical connector 940F is optionally coupled to test input control buffer circuit 40 (FIG. 1A). More than one member of electrical connectors 940A-940G may be required to change states when interface 930 operates as an interface between system IC 910 and a plurality of other integrated circuits, such as more than one auxiliary IC 920. For example, in one embodiment, electrical connector 940F is configured to change a state of interface 930 for testing of a first instance of auxiliary IC 920 and electrical connector 940C is configured to change a state of interface 930 for testing of a second instance of auxiliary IC 920.

The number of electrical connectors 940A-940G illustrated in the figures and discussed herein is purely for the purposes of example, alternative embodiments of the invention may include a greater or lesser number of electrical connectors 940A-940G.

Interface 930 is a multiplexing interface configured to convey signals between a first connector of auxiliary IC 920 and system IC 910 in the normal mode, and alternatively to convey signals between the first connector of auxiliary IC 920 and a member of electrical connectors 940A-940G in the test mode. The state of interface 930 is determinative of whether electronic device 900 is in the normal mode or the test mode. For example, in some embodiments, electronic device 900 is configured such that the presence of a first voltage at electrical connector 940F places interface 930 in the normal mode state and a second voltage at electrical connector 940F places interface 930 in the test mode state. In alternative embodiments, electronic device 900 is configured such that the state of interface 930 is also responsive to a signal received from system IC 910.

Figure 10:
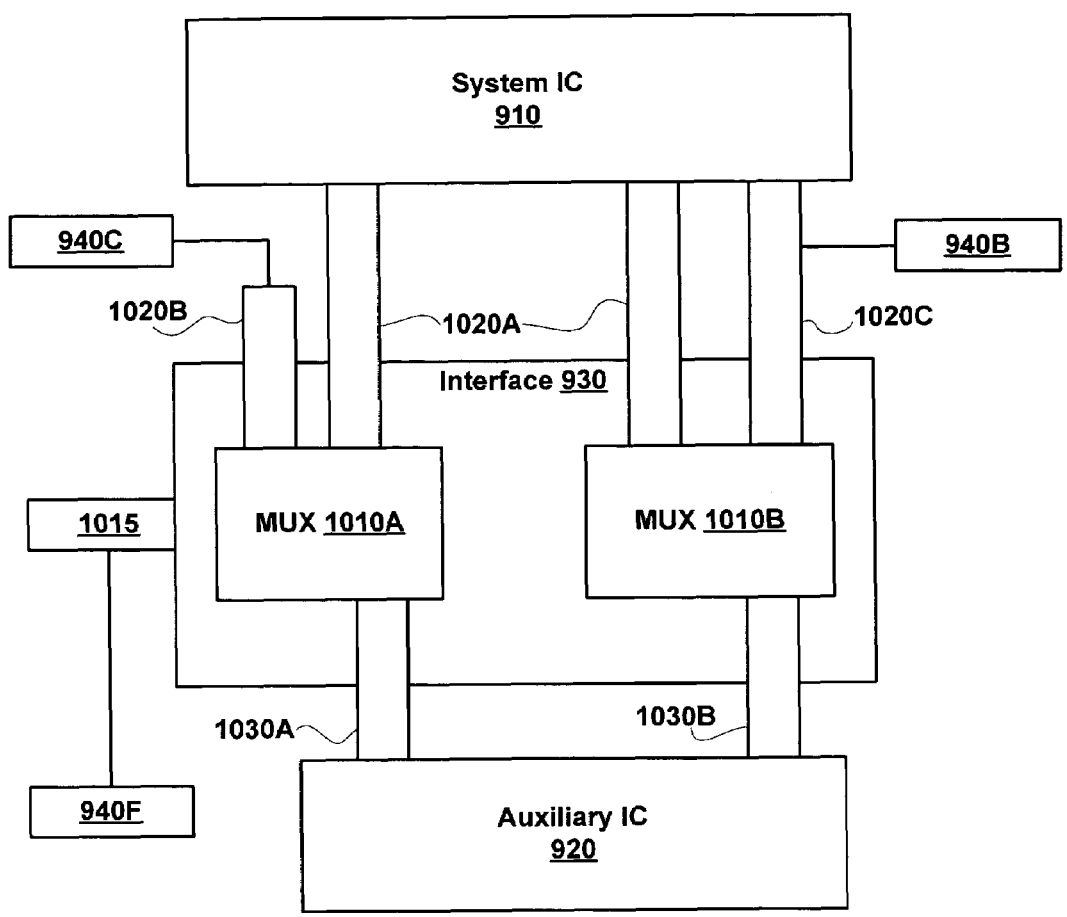
FIG. 10 illustrates further details of an interface, according to various embodiments of the invention.

FIG. 10 illustrates further details of interface 930, according to various embodiments of the invention. Interface 930 includes one or more multiplexer such as a MUX 1010A or a MUX 1010B. MUX 1010A and 1010B are each configured to receive an electronic signal at a first connector and to communicate the received signal to one of a plurality of other connectors responsive to the respective states of MUX 1010A and/or 1010B. Typically, MUX 1010A-1010B are bi-directional devices in which electronic signals are communicated in both directions. However, for the purposes of clarity, the discussion herein refers to some connectors as Inputs 1020A-1020C and other connectors as Outputs 1030A-1030B. Theses references are arbitrary and it should be understood that in most embodiments a particular connector may serve as both an input and output during bi-directional communications. Inputs 1020A-1020C and Outputs 1030A-1030B are optionally coupled to traces 19 and/or bonding wires 18 (FIG. 1A).

In the normal mode state, MUX 1010A is configured to convey a signal generated by system IC 910 and received through Input 1020A to Output 1030A where it may be received by auxiliary IC 920. In the test mode state of interface 930, or in at least a programming phase thereof, MUX 1010A is configured to convey a signal received at Input 1020B to Output 1030A where it may be received by auxiliary IC 920. The signal received at Input 1020B is optionally received directly from a member of electrical connectors 940A-940G. Typically, in the test mode state, a signal received at Input 1020A will not be conveyed to Output 1030A, and in the normal mode state a signal received at Input 1020B will not be conveyed to Output 1030A. The state of MUX 1010A, and optionally MUX 1010B, are responsive to a signal received at an electrical connector 1015 which is typically electronically coupled to a member of electrical connectors 940A-940G. In some embodiments, the state of MUX 1010A is optionally changed without changing the state of MUX 1010B, and visa versa.

In various embodiments, MUX 1010A and MUX 1010B include a buffer, or are coupled to a buffer within auxiliary IC 920. In some of these embodiments, MUX 1010A and/or MUX 1010B include test buffer multiplexer circuits 22 (FIG. 1A).

FIGS. 11A and 11B illustrate bi-directional signal paths through MUX 1010A in the normal mode state and the test mode state, respectively. As shown in FIG. 11A, in the normal mode state of MUX 1010A, wherein electronic device 900 is operating in the normal mode, signals are conveyed along a signal path 1110 between system IC 910 and auxiliary IC 920 through MUX 1010A. As shown in FIG. 11B, in the test mode state of MUX 1010A signals are optionally conveyed along a signal path 1120 between auxiliary IC 920 and a member of electrical connectors 940A-940G.

FIG. 10 further shows that a member of inputs 1020A-1020C (e.g. input 1020C) to interface 930 may be shared by (e.g., electronically coupled to both) a member of electrical connectors 940A-940G and system IC 910. Thus, Input 1020C may be configured to receive signals from electrical connector 940B and convey these signals to Auxiliary IC 920 in the test mode state. While system IC 910 is configured to receive signals from electrical connector 940B in the normal mode state. Electrical Connector 940B is, thus, configured for communication to both system IC 910 and auxiliary IC 920.

Figure 12A:
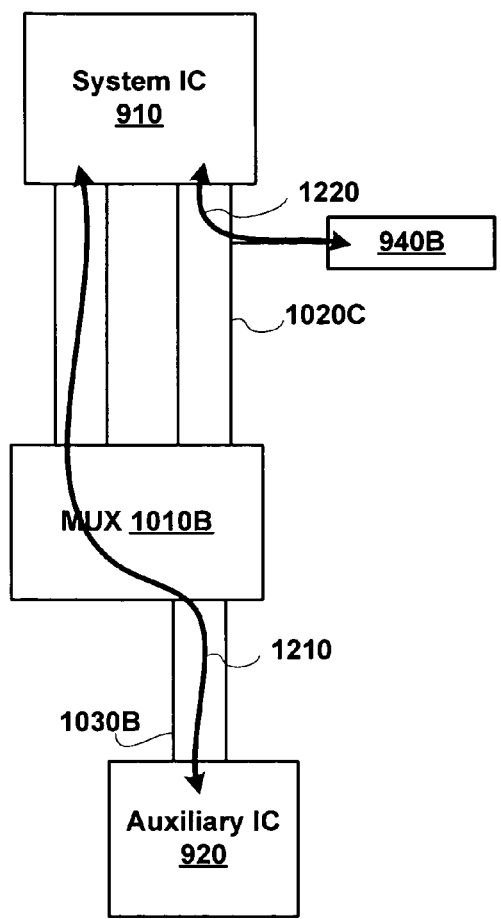
FIGS. 12A and 12B illustrate further bi-directional signal paths through a MUX, according to various embodiments of the invention.
Figure 12B:
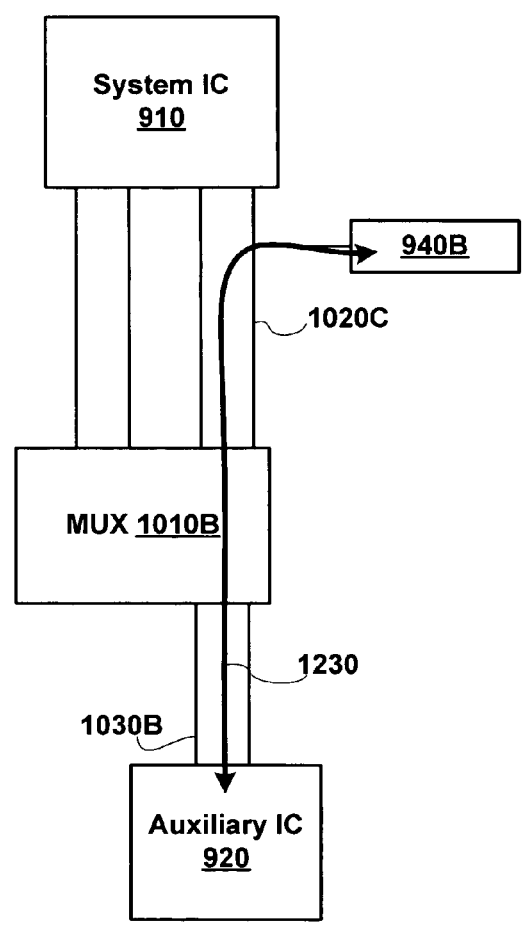

FIGS. 12A and 12B illustrate bi-directional signal paths through MUX 1010B in the normal mode state and the test mode state, respectively. As shown in FIG. 12A, in the normal mode state, signals are conveyed through a signal path 1210 between system IC 910 and auxiliary IC 920 through MUX 1010B, and signals are also conveyed through a signal path 1220 between system IC 910 and electrical connector 940B without necessarily passing through interface 930. As shown in FIG. 12B, in the test mode state, signals are conveyed through a signal path 1230 between electrical connector 940B and auxiliary IC 920 through interface 930. Thus, electrical connector 940B is configured to convey signals to different devices depending on whether electronic device 900 is in the normal mode or the test mode. Electrical connector 940B is, thus, a shared and multipurpose connection between components within electronic device 900 and external devices.

Figure 13:
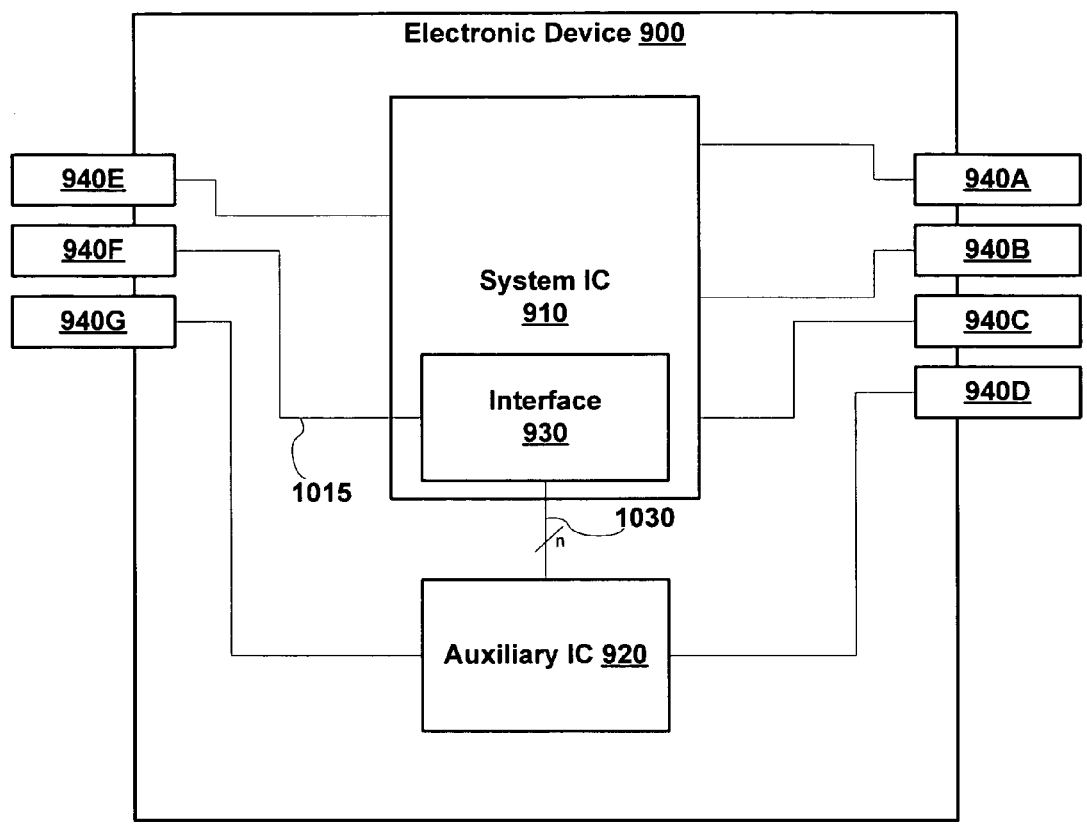
FIG. 13 illustrates alternative embodiments of the invention in which an interface is included within a system IC.

FIG. 13 illustrates alternative embodiments of the invention in which interface 930 is included within system IC 910. In these embodiments of system IC 910, interface 930 is optionally included on the same chip (e.g. semiconductor die) as other parts of system IC 910. In this case, interface 930 and system IC 910 may be considered systems on a chip. Alternatively, interface 930 and system IC 910 may be on separate semiconductor dies but be packaged separately from auxiliary IC 920. For example, interface 930 may be piggy-backed on system IC 910 or within the same semiconductor package.

Figure 14:
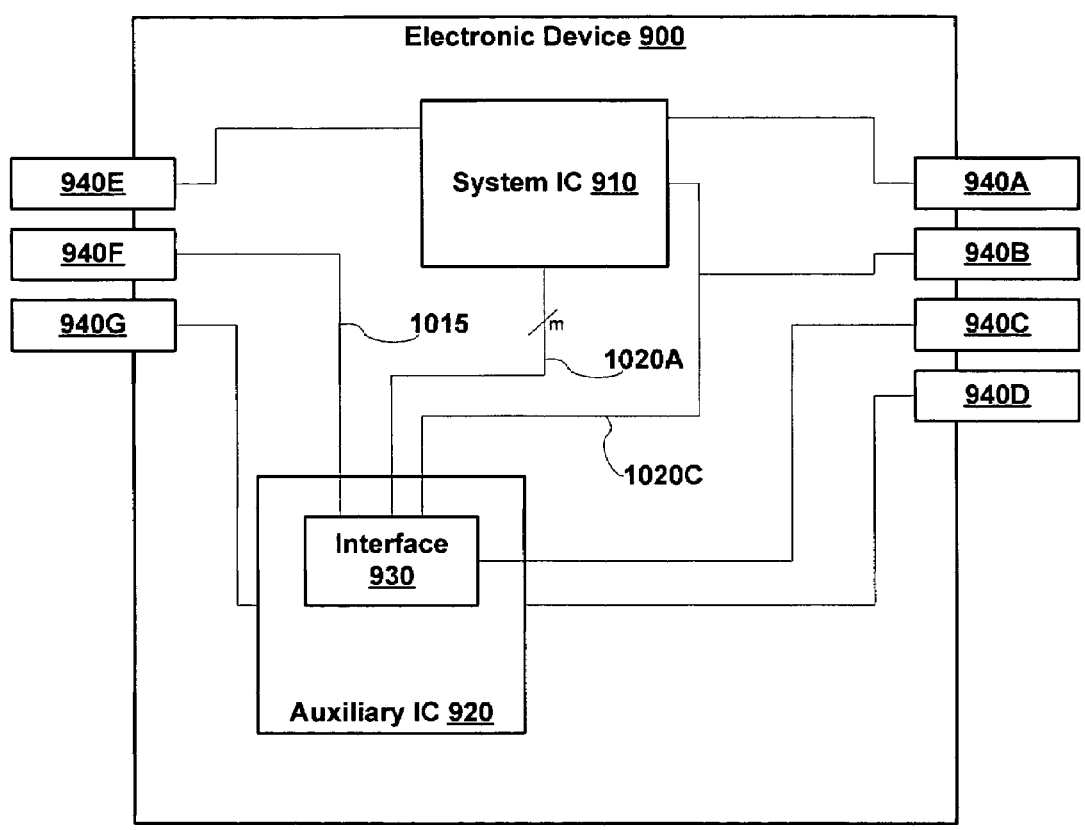
FIG. 14 illustrates alternative embodiments of the invention in which an interface is included within an auxiliary IC.

FIG. 14 illustrates alternative embodiments of the invention in which interface 930 is included within auxiliary IC 920. In these embodiments, interface 930 is optionally included on the same chip (e.g. semiconductor die) as other parts of auxiliary IC 920. In this case, interface 930 and auxiliary IC 920 may be considered systems on a chip. Alternatively, interface 930 and auxiliary IC 920 may be on separate semiconductor dies but be packaged separately from system IC 910. For example, interface 930 may be piggy-backed on auxiliary IC 920 or within the same semiconductor package. In alternative embodiments parts of interface 930 may be included in both system IC 910 and auxiliary IC 920.

Figure 15:
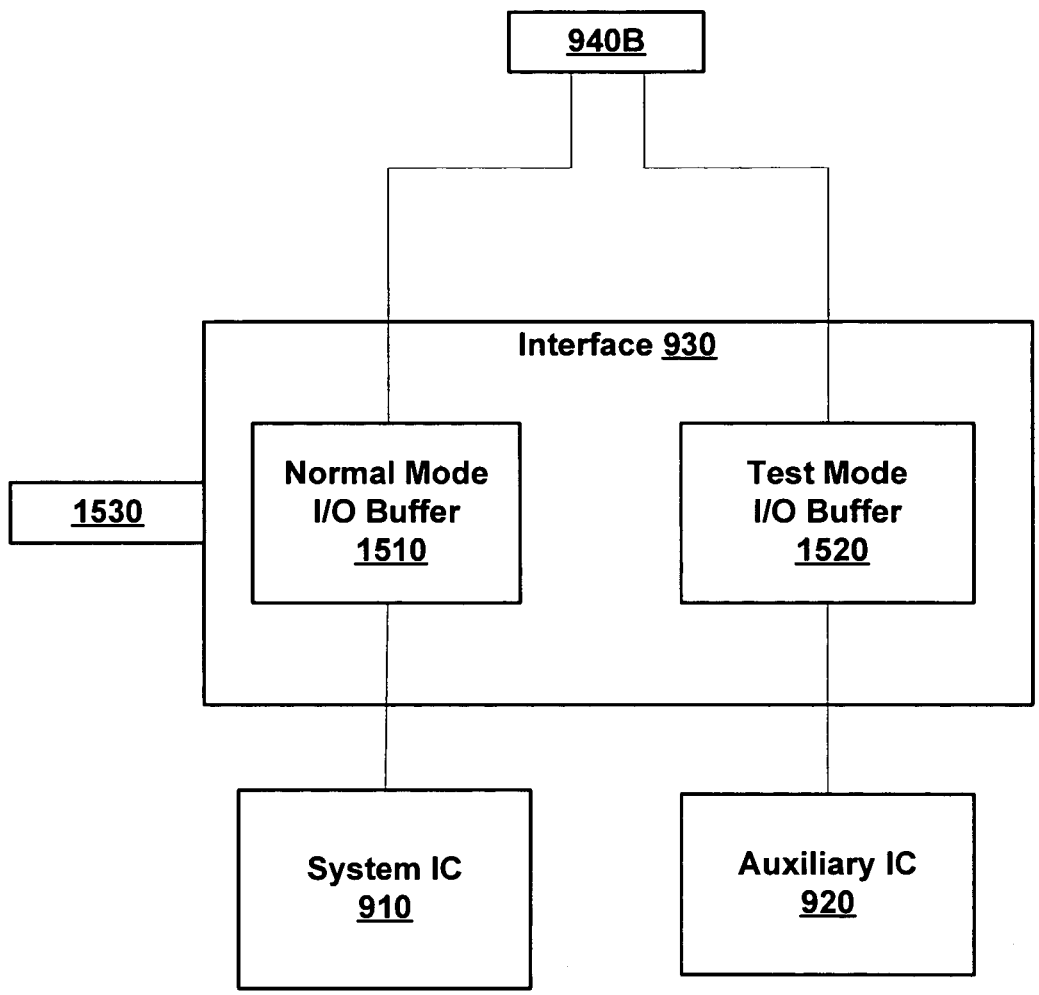
FIG. 15 illustrates an alternative embodiment of an interface.

FIG. 15 illustrates an alternative embodiment of Interface 930. This embodiment includes a Normal Mode I/O Buffer 1510 and a Test Mode I/O Buffer 1520 for use in the normal mode and the test mode respectively. An input 1530 is configured to turn on and off Normal Mode I/O Buffer 1510 and Test Mode I/O Buffer 1520 such that in the normal mode Normal Mode I/O Buffer 1510 is on and Test Mode I/O Buffer 1520 is off, and in the test mode Normal Mode I/O Buffer 1510 is off and Test Mode I/O Buffer is on. In the on state, Normal Mode I/O Buffer 1510 and Test Mode I/O Buffer 1520 are configured to receive data and make the received data available to another device such as System IC 910 and Auxiliary IC 920. In the off state, Normal Mode I/O Buffer 1510 and Test Mode I/O Buffer 1520 are configured not to convey data to other devices. Typically, only one of Normal Mode I/O Buffer 1510 and Test Mode I/O Buffer 1520 is on at the same time. Normal Mode I/O Buffer 1510 and Test Mode I/O Buffer 1520 may share a common input, such as Electrical Connector 940B. Normal Mode I/O Buffer 1510 and Test Mode I/O Buffer 1520 are each optionally disposed within System IC 910 and/or Auxiliary IC 920.

Figure 16:
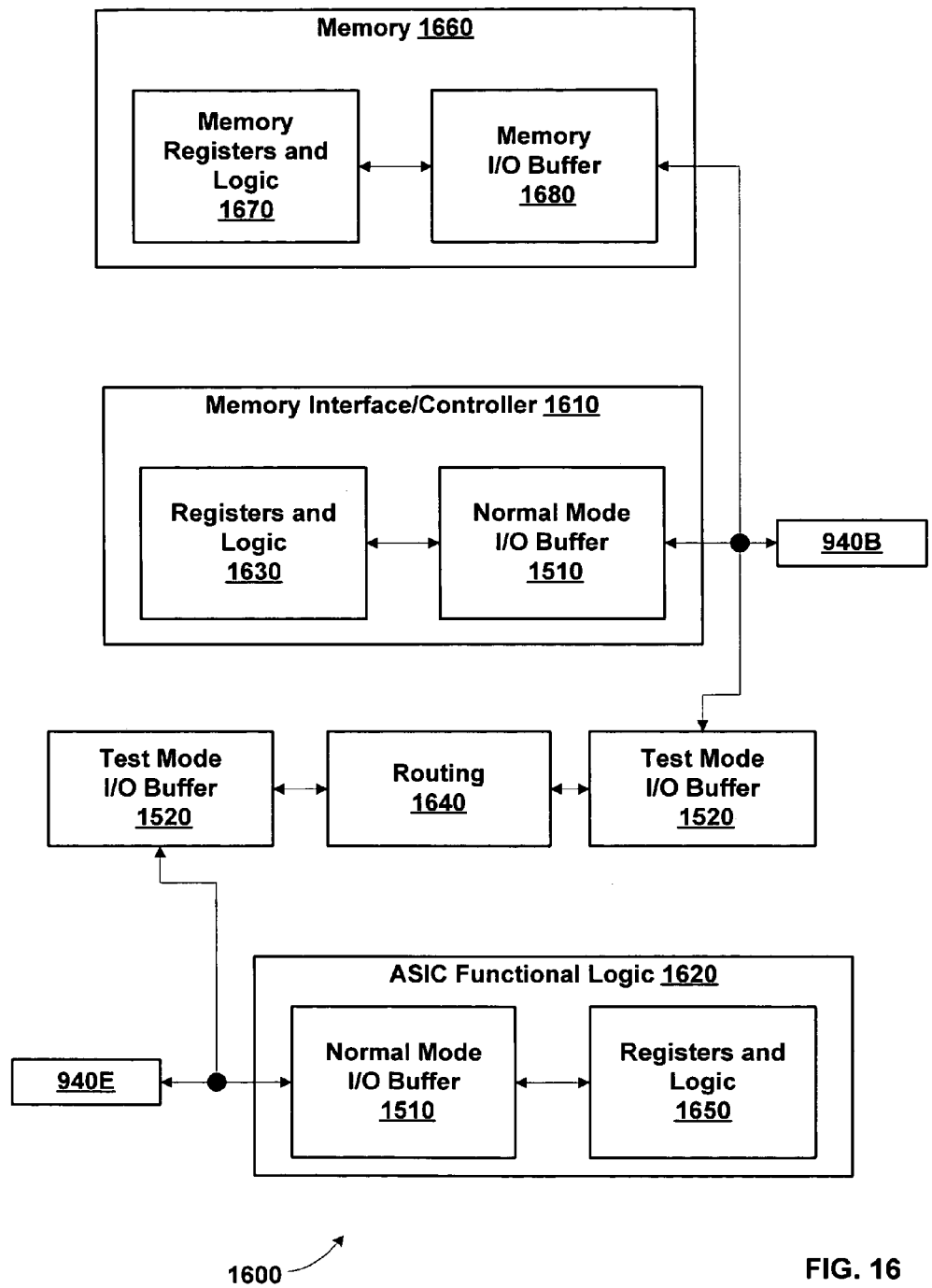
FIG. 16 illustrates an electronic device, according to various embodiments of the invention.

FIG. 16 illustrates an Electronic Device 1600, according to various embodiments of the invention. Electronic Device 1600 is optionally an embodiment of Electronic Device 900. Electronic Device 1600 includes a plurality of electronic circuits configured to operate in a test mode and a normal mode, and a plurality of Normal Mode I/O Buffer 1510 and Test Mode I/O Buffer 1520 configured to facilitate communications in each of these modes. While the examples presented in FIG. 16 include a Memory Interface/Controller 1610, an ASIC Functional Logic 1620 and a Memory 1660, the electronic circuits included in Electronic Device 1600 may include System IC 910 and Auxiliary IC 920. For example, System IC 910 may comprise Memory Interface/Controller 1610 and ASIC Functional Logic 1620 while Auxiliary IC 920 may include Memory 1660.

Memory Interface/Controller 1610 Includes Registers and Logic 1630 as well as an instance of Normal Mode I/O Buffer 1510 and an ASIC Functional Logic 1620. ASIC Functional Logic 1620 includes a Registers and Logic 1650 as well as an instance of Normal Mode I/O Buffer 1510. The instances of Normal Mode I/O Buffer 1510 included in ASIC Functional Logic 1620 and Memory Interface/Controller 1610 are on when Electronic Device 1600 is in the normal operation mode and optionally off when Electronic Device 1600 is in the test operation mode. Each of these instances of Normal Mode I/O Buffer 1510 share an input (e.g., Electrical Connectors 940E and/or 940B) with an instance of Test Mode I/O Buffer 1520. In the normal operation mode data received at these inputs is conveyed to ASIC Functional Logic 1620 and Memory Interface/Controller 1610, while in the test operation mode data received at these inputs conveyed through an optional Routing 1640 using the instances of Test Mode I/O Buffer 1520.

Routing 1640 includes electrical connections configured for conveying data between the instances of Test Mode I/O Buffer 1520. These electrical connections are optionally configured such that data is received at appropriate times in the test mode. For example, they may be configured to result in appropriate delay times. In some embodiments, Routing 1640 includes electrical traces within System IC 910. In some embodiments, delay times are responsive to data stored in a register and are thus programmable.

Memory 1660 is optionally an embodiment of Auxiliary IC 920. Memory 1660 includes a Memory Registers and Logic 1670 and a Memory I/O Buffer 1680. Memory I/O Buffer 1680 is typically configured to be operated independent of whether Electronic Device 1600 is in the normal mode or the test mode. Electrical Connector 940B is optionally shared by Memory 1660 and Memory Interface/Controller 1610.

In some embodiments, Electronic Device 1600 is operated as follows. In the normal operation mode data received via Electrical Connector 940E is conveyed to ASIC Functional Logic 1620 via the instance of Normal Mode I/O Buffer 1510 included in ASIC Functional Logic 1620. Also, data received at Electrical Connector 940B is conveyed to Memory Interface/Controller 1610 and optionally Memory 1660. In the test operation mode data received via Electrical Connector 940E is conveyed, via Test Mode I/O Buffer 1520, to Memory Interface/Controller 1610 and/or Memory 1660. Thus, Electrical Connector 940 is configured to serve different functions in the different modes.

In some embodiments, Electrical Connectors 940B and/or 940E are shared bond pads of a system-in-package or system-in-module.

Figure 17:
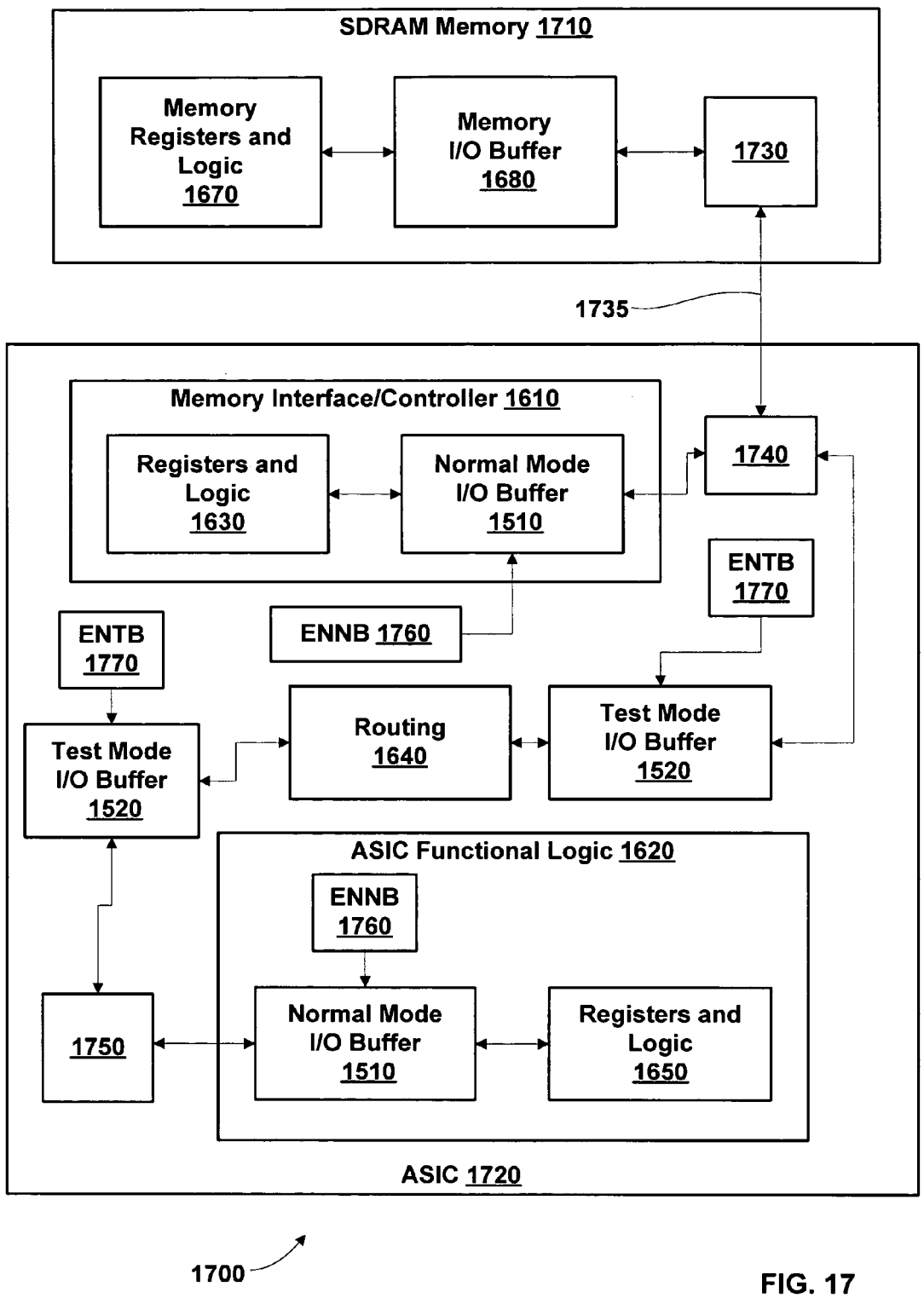
FIG. 17 illustrates an electronic device, according to various embodiments of the invention.

FIG. 17 illustrates an Electronic Device 1700 configured to operate in the normal mode and the test mode, according to various embodiments of the invention. Electronic Device 1700 is optionally an embodiment of Electronic Device 1600. In Electronic Device 1700, Memory Interface/Controller 1610, one or more instances of Test Mode I/O Buffer 1520, optional Routing 1640 and ASIC Functional Logic 1620 are disposed within an ASIC 1720. ASIC 1720 is optionally disposed within a system-on-chip or a system-in-package.

Electronic Device 1700 further includes an Electrical Connector 1740 configured to convey I/O signals to and from a SDRAM Memory 1710. Electrical Connector 1740 is optionally an instance of Electrical Connector 940B and is optionally a bond pad. For example, Electrical Connector 1740 is optionally a shared SDRAM I/O bond pad. In the normal mode Electrical Connector 1740 is configured to convey I/O signals between Memory Interface/Controller 1610 and SDRAM Memory 1710, while in the test mode Electrical Connector 1740 is configured to convey signals between SDRAM Memory 1710 and either ASIC Functional Logic 1620 and/or an Electrical Connector 1750 (via Test Mode I/O Buffer 1520 or a MUX (not shown)).

Electrical Connector 1750 is optionally an instance of Electrical Connector 940E. For example, Electrical Connector 1750 is optionally a shared general purpose I/O bond pad. In the normal mode, Electrical Connector 1750 is configured to convey data to and from Registers and Logic 1650 of ASIC Functional Logic 1620 via Normal Mode I/O Buffer 1510. In the test mode, Electrical Connector 1750 is configured to convey data to and from SDRAM Memory 1710 via one or more instances of Test Mode I/O Buffer 1520 or a MUX (not shown).

ASIC 1720 further includes inputs designated ENNB (Enable Normal Buffer) 1760 and ENTB (Enable Test Buffer) 1770. ENNB 1760 is configured to enable instances of Normal Mode I/O Buffer 1510 and ENTB 1770 is configured to enable instances of Test Mode I/O Buffer 1520, in the normal mode and test mode respectively. In some embodiments, ENNB 1760 and ENTB 1770 comprise a single input and a NOT gate is used to differentiate signals meant for Normal Mode I/O Buffer 1510 and Test Mode I/O Buffer 1520.

SDRAM Memory 1710 is optionally an embodiment of Memory 1660 in which Memory I/O Buffer 1680 communicates through at least an Electrical Connector 1730. Electrical Connector 1730 is optionally a bond pad electronically coupled to Electrical Connector 1740 via SDRAM I/O 1735. SDRAM Memory 1710 is optionally replaced by other types of memory including DRAM, or by other embodiments of Auxiliary IC 920 (FIG. 9).

Figure 18:
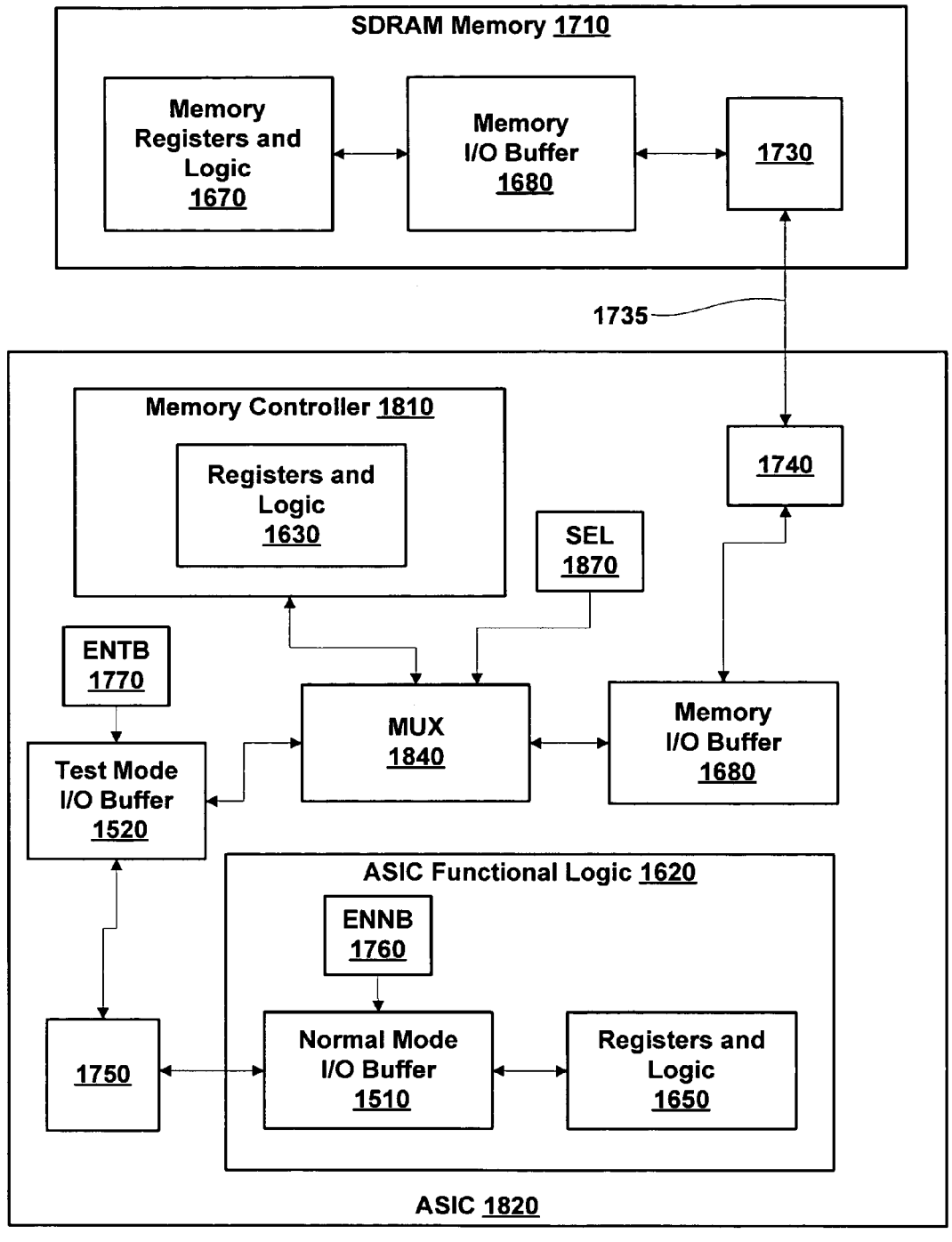
FIG. 18 illustrates an electronic device, according to various embodiments of the invention.

FIG. 18 illustrates an Electronic Device 1800, according to various embodiments of the invention. Electronic Device 1800 is an alternative embodiment of Electronic Device 1700 including multiplexed I/O buffers between an ASIC 1820 and SDRAM Memory 1710. ASIC 1820 includes a MUX 1840 responsive to an optional control input SEL 1870. MUX 1840 is optionally an instance of MUX 1010A or MUX 1010B (FIG. 10), and SEL 1870 is optionally coupled to Electrical Connector 940F (FIG. 9).

In the normal mode, MUX 1840 is configured to convey signals between a Memory Controller 1810 and an instance of Memory I/O Buffer 1680 included in ASIC 1820. For example, in the normal mode, data generated by Memory Controller 1810 is communicated through MUX 1840 to Memory I/O Buffer 1680 and then to SDRAM Memory 1710, and vice versa.

In the test mode, MUX 1840 is configured to convey signals between Electrical Connector 1750 and the instance of Memory I/O Buffer 1680 included in ASIC 1820. For example, in the test mode, signals received at Electrical Connector 1750 are communicated through MUX 1840 to Memory I/O Buffer 1680 and then to SDRAM Memory 1710, and vice versa.

Memory Controller 1810 is an embodiment of Memory Interface/Controller 1610 without Normal Mode I/O Buffer 1510.

Figure 19:
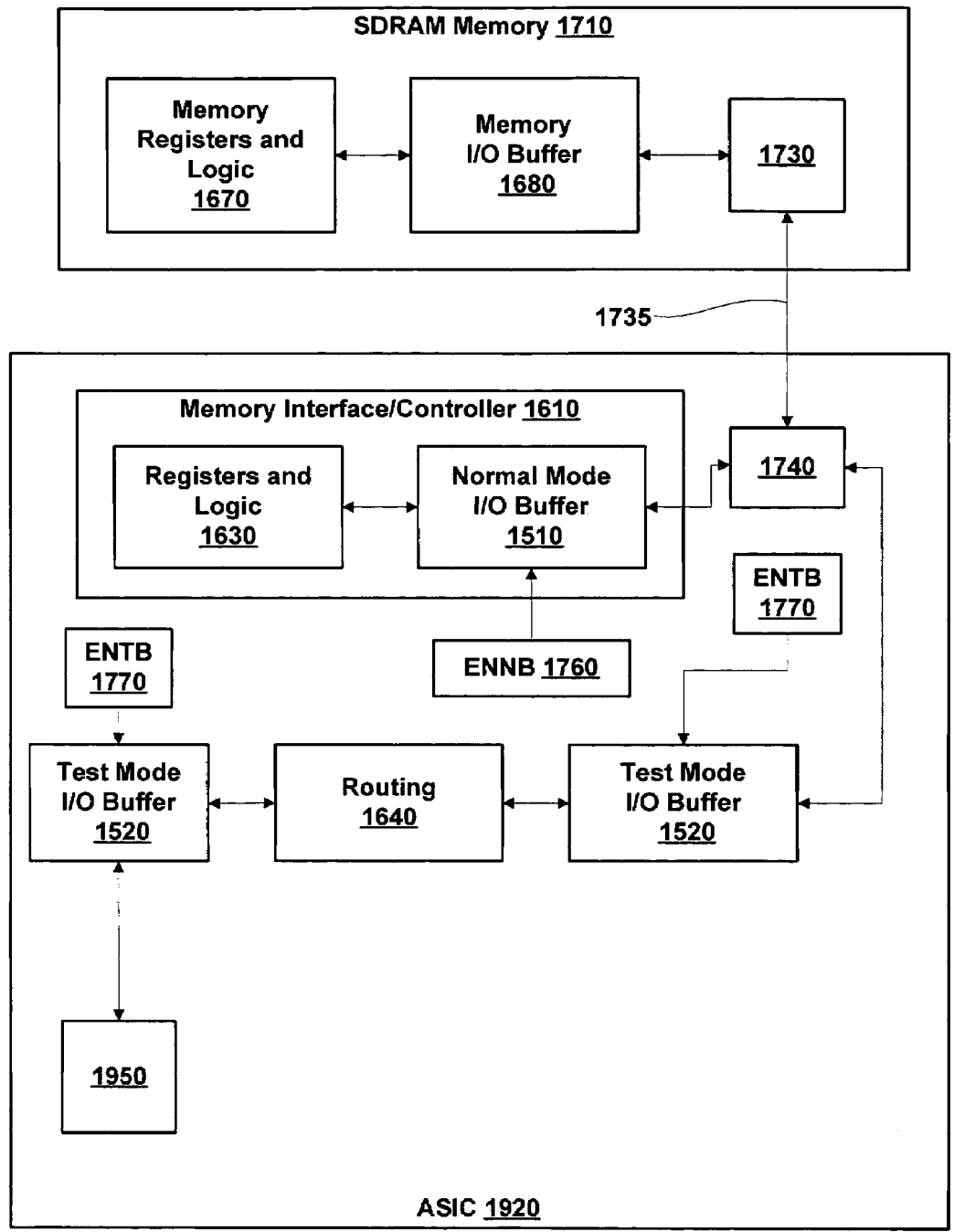
FIG. 19 illustrates an electronic device, according to various embodiments of the invention.

FIG. 19 illustrates an Electrical Device 1900, according to various embodiments of the invention. Electrical Device 1900 is an alternative embodiment of Electronic Device 1700 including an ASIC 1920 in which Electrical Connector 1750 is replaced by a Dedicated Electrical Connector 1950. Unlike Electrical Connector 1750, Dedicated Electrical Connector 1950 is not shared and is thus dedicated for use in the test mode to communicate with SDRAM Memory 1710. Dedicated Electrical Connector 1950 is optionally a bond pad, solder point, pin, or the like.

Figure 20:
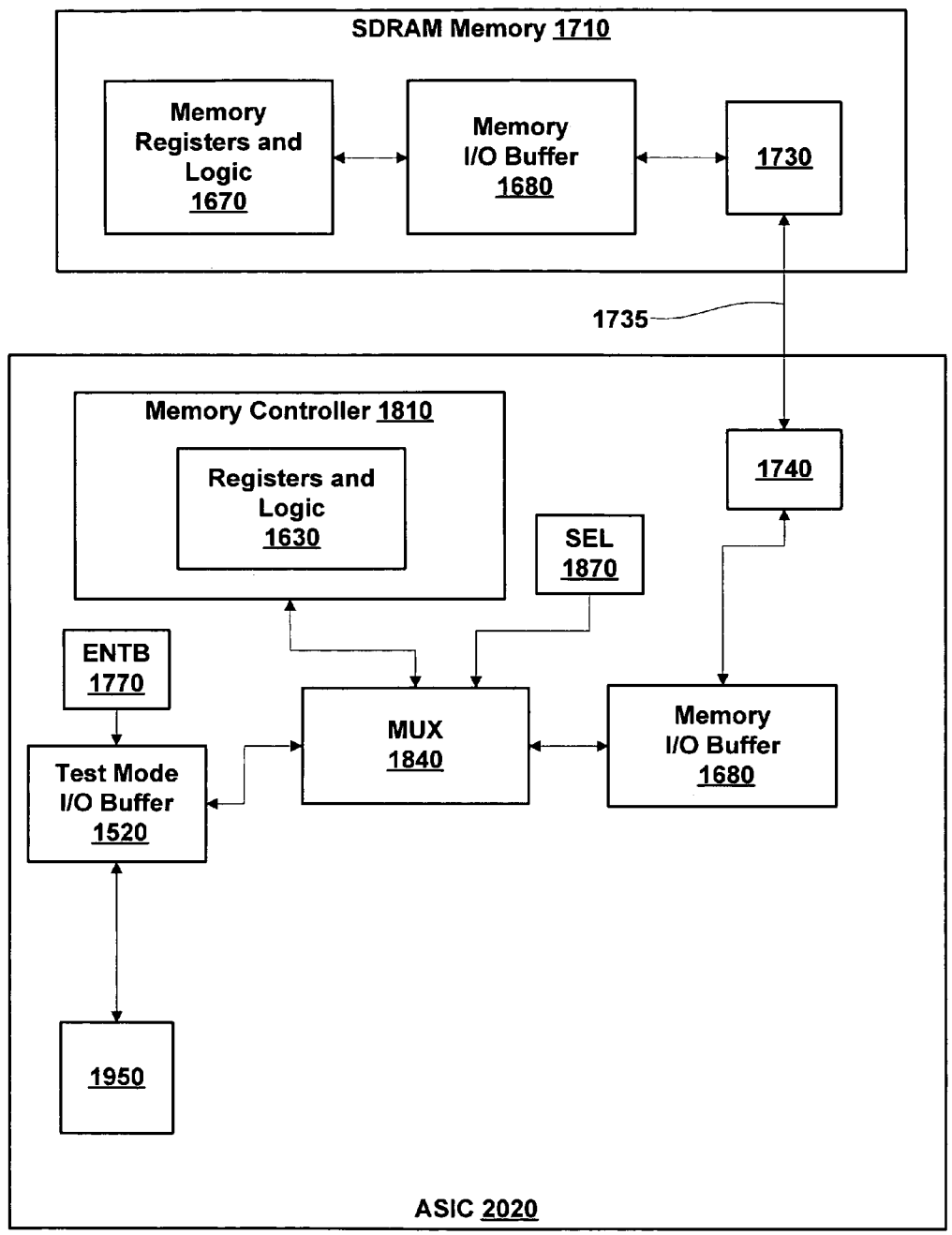
FIG. 20 illustrates an electronic device, according to various embodiments of the invention.

FIG. 20 illustrates an Electrical Device 2000, according to various embodiments of the invention. Electrical Device 2000 is an alternative embodiment of Electronic Device 1800 in which an ASIC 2020 includes Dedicated Electrical Connector 1950. ASIC 2020 is an alternative embodiment of ASIC 1820.

ASIC 1720, ASIC 1820, ASIC 1920 and ASIC 2020 are each optionally replaced by other embodiments of System IC 910 (FIG. 9). In the embodiments illustrated by FIGS. 19 and 20, Electrical Connector 1740 is optionally a shared electrical connector, such as a shared bond pad.

Several embodiments are specifically illustrated and/or described herein. However, it will be appreciated that modifications and variations are covered by the above teachings and within the scope of the appended claims without departing from the spirit and intended scope thereof. For example, electronic device 900 is optionally configured such that interface 930 includes one state configured for testing auxiliary IC 920, another state configured for testing system IC 910, and a third state for normal operation of electronic device 900. In these embodiments, some members of electronic connectors 940A-940G may be inputs shared between system IC 910 and interface 930, while other members of electronic connectors 940A-940G may be inputs shared between auxiliary IC 920 and interface 930. Further, while electronic devices are discussed herein, embodiments of the invention may include optoelectronic circuits or optical circuits.

In some embodiments, the state (e.g., mode) of interface 930 is changed responsive to a command being received by system IC 910 and/or auxiliary IC 920. For example, system IC 910 or auxiliary IC 920 may be configured to receive a command and store the received command in a register. In response to receiving and storing a specific state change command, system IC 910 or auxiliary IC 920 send a signal to interface 930, the signal being configured to change the state of interface 930. In these embodiments, a member of electrical connectors 940A-940G need not be dedicated to changing a state of interface 930, such that electronic device 900 alternatively operates in the normal mode or the test mode.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
   a first integrated circuit configured to operate in at least a normal mode and a test mode;
   a second integrated circuit, both the first integrated circuit and the second integrated circuit being disposed within the same semiconductor device package;
   a first terminal external to the semiconductor device package, electronically coupled to the first integrated circuit and the second integrated circuit, and configured to receive a first signal for use by the first integrated circuit and to receive a second signal for use by the second integrated circuit; and
   at least one multiplexer circuit, the multiplexer circuit configured to receive the second signal from the first terminal and to convey the second signal for use by the second integrated circuit when the first integrated circuit is in the normal mode, and configured to receive the first signal from the first terminal and to convey the first signal to the first integrated circuit in the test mode.

2. The system of claim 1, wherein the first integrated circuit is an interface circuit coupled to a third integrated circuit configured to be tested in the test mode.

3. The system of claim 1, wherein the at least one multiplexer circuit includes a data buffer.

4. The system of claim 1, further including a third integrated circuit configured to be tested in the test mode.

5. The system of claim 1, wherein the first integrated circuit and the at least one multiplexer are disposed in separate semiconductor packages.

6. A system comprising:
   a first integrated circuit configured to operate in at least a normal mode and a test mode;
   a second integrated circuit, both the first integrated circuit and the second integrated circuit being disposed within the same semiconductor device package;
   a first terminal external to the semiconductor device package, electronically coupled to the first integrated circuit and the second integrated circuit, and configured to receive a first signal for use by the first integrated circuit and to receive a second signal for use by the second integrated circuit;

at least one multiplexer circuit, the multiplexer circuit configured to receive the second signal from the first terminal and to convey the second signal for use by the second integrated circuit when the first integrated circuit chip is in the normal mode, and configured to receive the first signal from the first terminal and to convey the first signal to the first integrated circuit in the test mode; and a register configured to receive a command for causing the at least one multiplexer circuit to transition between the normal mode and the test mode.

7. The system of claim 6, further including a second terminal external to the semiconductor device package configured to receive a signal for causing the at least one multiplexer circuit to transition between the normal mode and the test mode.

8. The system of claim 6, wherein the register is disposed within the first integrated circuit or the second integrated circuit.

9. The system of claim 6, wherein the first integrated circuit comprises a memory device or a logic device.

10. The system of claim 6, wherein the first integrated circuit comprises a logic device.

11. The system of claim 6, wherein the first integrated circuit comprises a logic chip, a gate array, a programmable logic device, a processor, an application specific integrated circuit, a microprocessor, a microcontroller, or a digital signal processor.

12. The system of claim 6, wherein the first integrated circuit is configured to be tested in the test mode.

13. The system of claim 6, wherein the at least one circuit is further configured to communicate the first signal from the second integrated circuit to the first integrated circuit when the first integrated circuit is in the normal mode, and further configured to communicate the second signal from the first terminal for use by the second integrated circuit when the first integrated circuit is in the test mode.

14. A system comprising:

a logic device configured to operate in at least a normal mode and a test mode;

an integrated circuit, both the logic device and the integrated circuit being disposed within the same semiconductor device package;

a first terminal external to the semiconductor device package, electronically coupled to the logic device and the integrated circuit, and configured to operate as a shared input for the logic device and the integrated circuit;

a multiplexer circuit operable to communicate a first signal from the integrated circuit to the logic device in the normal mode, and operable to communicate a second signal from the first terminal to the logic device in test mode; and a second terminal external to the semiconductor device package configured to receive a third signal for causing a transition between the normal mode and the test mode.

15. The system of claim 14, wherein the multiplexer circuit is disposed within the integrated circuit.

16. A system comprising:

a logic device configured to operate in at least a normal mode and a test mode;

an integrated circuit, both the logic device and the integrated circuit being disposed within the same semiconductor device package;

a first terminal external to the semiconductor device package, electronically coupled to the logic device and the integrated circuit, and configured to operate as a shared input for the logic device and the integrated circuit;

a multiplexer circuit operable to communicate a first signal from the integrated circuit to the logic device in the normal mode, and operable to communicate a second signal from the first terminal to the logic device in test mode, wherein the test mode comprises a programming phase and an access phase, in the programming phase test codes are loaded into the logic device, and in the access phase the logic device is operated to test for functionality; and a second terminal external to the semiconductor device package configured to receive a third signal for causing a transition between the normal mode and the test mode.

17. The system of claim 16, wherein the test codes are loaded serially.

18. A system comprising:

a first integrated circuit configured to operate in at least a normal mode and a test mode;

a second integrated circuit, both the first integrated circuit and the second integrated circuit being disposed within the same semiconductor device package;

an electrical conductor configured f or receiving at the first integrated circuit a signal from the second integrated circuit when the first integrated circuit is in the normal mode, and for receiving at the first integrated circuit a signal from a terminal external to the semiconductor device package when the first integrated circuit is in test mode; and means for causing the first integrated circuit to transition between the normal mode and the test mode.

19. The system of claim 18, wherein the first integrated circuit includes memory or a logic device.

20. The system of claim 18, wherein the first integrated circuit comprises a gate array, a programmable logic device, a processor, an application specific integrated circuit, a microprocessor, a microcontroller, or a digital signal processor.

21. A system comprising:

a first integrated circuit configured to operate in at least a normal mode and a test mode;

a second integrated circuit, both the first integrated circuit and the second integrated circuit being disposed within the same semiconductor device package;

shared means for receiving at the first integrated circuit a signal from the second integrated circuit when the first integrated circuit is in the normal mode, and for receiving at the first integrated circuit a signal from a terminal external to the semiconductor device package when the first integrated circuit is in test mode, wherein the means for receiving includes a first buffer circuit connected to receive a signal from the second integrated circuit when the first integrated circuit is in the normal mode, and a second buffer circuit connected to receive a signal from an external testing machine via the terminal external to the semiconductor device package; and means for causing the first integrated circuit to transition between the normal mode and the test mode.

22. A semiconductor device comprising:
a first chip;
a second chip configured to operate in a normal mode and a test mode, the second chip including at least a memory chip or a logic device;
a semiconductor device package including the first chip and the second chip;
one or more input terminals shared by the first chip and the second chip, at least part of each of the one or more input terminals being external to the semiconductor device package;
a plurality of multiplexer circuits, each multiplexer circuit operable to pass a respective signal from the first chip when the second chip is in the normal operation mode, each multiplexer circuit operable to pass a respective signal from a respective member of the one or more input terminals when the first chip is in the test mode; and
a test input control buffer circuit configured to receive a signal for causing the second chip to transition between the normal mode and the test mode.

23. The semiconductor device of claim 22, wherein the plurality of multiplexer circuits are included in the second chip.

24. A semiconductor device comprising:
a first chip;
a second chip configured to operate in a normal mode and a test mode, the second chip including at least a memory chip or a logic device;
a semiconductor device package including the first chip and the second chip;
one or more input terminals shared by the first chip and the second chip, at least part of each of the one or more input terminals being external to the semiconductor device package;
a plurality of multiplexer circuits, each multiplexer circuit operable to pass a respective signal from the first chip when the second chip is in the normal operation mode, each multiplexer circuit operable to pass a respective signal from a respective member of the one or more input terminals when the first chip is in the test mode, wherein the test mode comprises a programming phase and an access phase, in the programming phase test codes are loaded into the second chip, and in the access phase the second chip is operated to test for functionality; and
a test input control buffer circuit configured to receive a signal for causing the second chip to transition between the normal mode and the test mode.

25. The semiconductor device of claim 24, wherein the loading of test codes into the memory chip is performed asynchronously.

26. A semiconductor device comprising:
a first chip;
a second chip configured to operate in a normal mode and a test mode, the second chip including at least a memory chip or a logic device;
a semiconductor device package including the first chip and the second chip;
one or more input terminals shared by the first chip and the second chip, at least part of each of the one or more input terminals being external to the semiconductor device package;
a plurality of multiplexer circuits, each multiplexer circuit operable to pass a respective signal from the first chip when the second chip is in the normal operation mode, each multiplexer circuit operable to pass a respective signal from a respective member of the one or more input terminals when the first chip is in the test mode, wherein each multiplexer circuit comprises a first buffer circuit connected to receive a signal from the first chip during normal operation, and a second buffer circuit connected to receive a signal from an external testing machine via a respective member of the one or more terminals; and
a test input control buffer circuit configured to receive a signal for causing the second chip to transition between the normal mode and the test mode.

27. An electronic device comprising:
a plurality of connectors configured for communicating electronic signals between the electronic device and devices external to the electronic device;
a system integrated circuit configured to receive and use electronic signals from at least a first member of the plurality of connectors;
an auxiliary integrated circuit configured to be tested when the electronic device operates in a testing mode and to operate normally when the electronic device operates in a normal mode; and
an interface including one or more multiplexer circuit each configured to convey electronic signals between the system integrated circuit and the auxiliary integrated circuit when the electronic device operates in the normal mode, and to convey electronic signals between the first member of the plurality of connectors and the auxiliary integrated circuit when the electronic device operates in the testing mode.

28. The electronic device of claim 27, wherein the interface and the auxiliary integrated circuit are packaged separately from the system integrated circuit.

29. The electronic device of claim 27, wherein the interface and the system integrated circuit are packaged separately from the auxiliary integrated circuit.

30. The electronic device of claim 27, wherein the system integrated circuit, the interface and the auxiliary integrated circuit are each packaged separately.

31. The electronic device of claim 27, wherein the auxiliary integrated circuit comprises a gate array, a programmable logic device, a processor, an application specific integrated circuit, a microprocessor, a microcontroller, memory or a digital signal processor.

32. The electronic device of claim 27, wherein the system integrated circuit, the interface and the auxiliary integrated circuit are separately mounted on a printed circuit board.

33. The electronic device of claim 27, wherein the system integrated circuit, the interface and the auxiliary integrated circuit comprise a system-in-module.

34. A method of operating an electronic device, the method comprising:
operating the electronic device in a normal mode, the normal mode including communicating a first signal from a device external to the electronic device through a first electrical connector to a system integrated circuit disposed within the electronic device, and communicating a second signal from the system integrated circuit through a multiplexer to an auxiliary integrated circuit, the first electrical connector being shared by the system integrated circuit and the multiplexer;
applying a third signal from a device external to the electronic device to a second electrical connector, the third signal being configured to change the state of the multiplexer such that the electronic device is operable in a test mode; and operating the electronic device in the test mode, the test mode including communicating a fourth signal from a device external to the electronic device through the first electrical connector to the auxiliary integrated circuit via the multiplexer, the test mode being configured for testing the auxiliary integrated circuit.

35. The method of claim 34, wherein the fourth signal includes data configured for testing the auxiliary integrated circuit.

36. The method of claim 34, wherein the test mode includes a data loading phase and an operation phase.

37. The method of claim 34, wherein the fourth signal is not received by the system integrated circuit.

38. The method of claim 34, wherein the system integrated circuit and the auxiliary integrated circuit are disposed in separate packages.

* * * * *